(12) United States Patent
Hatano

(10) Patent No.: US 11,189,642 B2
(45) Date of Patent: Nov. 30, 2021

(54) SEMICONDUCTOR DEVICE AND LIGHT-EMITTING DEVICE

(75) Inventor: Kaoru Hatano, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 1330 days.

(21) Appl. No.: 13/223,475

(22) Filed: Sep. 1, 2011

(65) Prior Publication Data

US 2012/0061671 A1     Mar. 15, 2012

(30) Foreign Application Priority Data

Sep. 10, 2010    (JP) .............................. JP2010-203341

(51) Int. Cl.
    *H01L 29/04*         (2006.01)
    *H01L 29/10*         (2006.01)
                  (Continued)

(52) U.S. Cl.
    CPC .... *H01L 27/1225* (2013.01); *H01L 29/78606* (2013.01); *H01L 51/5259* (2013.01)

(58) Field of Classification Search
    CPC . H01J 1/70; H05B 33/22; H05B 33/04; H01L 51/5237; H01L 2924/0002; H01L 27/1225; H01L 29/78606; H01L 51/5259
    See application file for complete search history.

(56) References Cited

U.S. PATENT DOCUMENTS 5,731,856 A    3/1998   Kim et al.
5,744,864 A    4/1998   Cillessen et al.
(Continued)

FOREIGN PATENT DOCUMENTS

CN        101262942 A     9/2008
EP         1 737 044 A1    12/2006
(Continued)

OTHER PUBLICATIONS

Asakuma, N et al., "Crystallization and Reduction of Sol-Gel-Derived Zinc Oxide Films By Irradiation With Ultraviolet Lamp," Journal of Sol-Gel Science and Technology, 2003, vol. 26, pp. 181-184.
(Continued)

*Primary Examiner* — Meiya Li
(74) *Attorney, Agent, or Firm* — Fish & Richardson P.C.

(57) ABSTRACT

To provide a highly reliable semiconductor device including an oxide semiconductor. Further to provide a highly reliable light-emitting device including an oxide semiconductor. A second electrode sealed together with a semiconductor element including an oxide semiconductor hardly becomes inactive. A hydrogen ion and/or a hydrogen molecule produced by reaction of the active second electrode with moisture remaining in the semiconductor device and/or moisture entering from the outside of the device increase the carrier concentration in the oxide semiconductor, which causes a reduction in the reliability of the semiconductor device. An adsorption layer of a hydrogen ion and/or a hydrogen molecule may be provided on the other surface side of the second electrode having one surface in contact with the organic layer. Further, an opening which a hydrogen ion and/or a hydrogen molecule passes through may be provided for the second electrode.

3 Claims, 8 Drawing Sheets

(51) Int. Cl.
  *H01L 31/00*   (2006.01)
  *H01L 27/12*   (2006.01)
  *H01L 51/52*   (2006.01)
  *H01L 29/786*  (2006.01)

(56) References Cited

U.S. PATENT DOCUMENTS

| | | |
|---|---|---|
| 6,274,887 B1 | 8/2001 | Yamazaki et al. |
| 6,277,679 B1 | 8/2001 | Ohtani |
| 6,294,274 B1 | 9/2001 | Kawazoe et al. |
| 6,445,005 B1 | 9/2002 | Yamazaki et al. |
| 6,563,174 B2 | 5/2003 | Kawasaki et al. |
| 6,580,094 B1 | 6/2003 | Yamazaki et al. |
| 6,617,644 B1 | 9/2003 | Yamazaki et al. |
| 6,727,522 B1 | 4/2004 | Kawasaki et al. |
| 6,784,612 B2 | 8/2004 | Park et al. |
| 6,924,594 B2 | 8/2005 | Ogura et al. |
| 6,946,361 B2 | 9/2005 | Takayama et al. |
| 6,965,195 B2 | 11/2005 | Yamazaki et al. |
| 7,045,944 B2 | 5/2006 | Ushifusa et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,106,001 B2 | 9/2006 | Kim et al. |
| 7,211,825 B2 | 5/2007 | Shih et al. |
| 7,230,271 B2 | 6/2007 | Yamazaki et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,361,573 B2 | 4/2008 | Takayama et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,473,928 B1 | 1/2009 | Yamazaki et al. |
| 7,501,293 B2 | 3/2009 | Ito et al. |
| 7,622,861 B2 | 11/2009 | Oooka et al. |
| 7,674,650 B2 | 3/2010 | Akimoto et al. |
| 7,696,513 B2 | 4/2010 | Hayashi et al. |
| 7,732,819 B2 | 6/2010 | Akimoto et al. |
| 7,791,072 B2 | 9/2010 | Kumomi et al. |
| 7,948,171 B2 | 5/2011 | Sakakura et al. |
| 8,017,422 B2 | 9/2011 | Fujii et al. |
| 8,067,775 B2 | 11/2011 | Miyairi et al. |
| 8,202,365 B2 | 6/2012 | Umeda et al. |
| 8,237,166 B2 | 8/2012 | Kumomi et al. |
| 8,911,862 B2 | 12/2014 | Giannantonio et al. |
| 9,029,851 B2 | 5/2015 | Miyairi et al. |
| 9,318,512 B2 | 4/2016 | Miyairi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0064569 A1 | 4/2003 | Takayama et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0095060 A1* | 5/2004 | Ushifusa et al. ............ 313/495 |
| 2004/0127038 A1 | 7/2004 | Carcia et al. |
| 2005/0017302 A1 | 1/2005 | Hoffman |
| 2005/0073247 A1* | 4/2005 | Yamazaki ........... H01L 27/3211 313/503 |
| 2005/0199959 A1 | 9/2005 | Chiang et al. |
| 2005/0231107 A1* | 10/2005 | Yamazaki ........... H01L 27/3276 313/506 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0085475 A1 | 4/2007 | Kuwabara et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0215867 A1* | 9/2007 | Kawakami et al. ............ 257/40 |
| 2007/0252928 A1 | 11/2007 | Ito et al. |
| 2007/0268581 A1* | 11/2007 | Palmateer ............ B81B 7/0038 359/512 |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0211394 A1* | 9/2008 | Koshihara ............... G06F 3/044 313/504 |
| 2008/0224133 A1 | 9/2008 | Park et al. |
| 2008/0226902 A1* | 9/2008 | Giannantonio et al. ....... 428/336 |
| 2008/0246407 A1 | 10/2008 | Yoshida et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2009/0008639 A1 | 1/2009 | Akimoto et al. |
| 2009/0008667 A1 | 1/2009 | Fujii et al. |
| 2009/0068773 A1 | 3/2009 | Lai et al. |
| 2009/0072233 A1 | 3/2009 | Hayashi et al. |
| 2009/0073325 A1 | 3/2009 | Kuwabara et al. |
| 2009/0108745 A1* | 4/2009 | Koshiyama ......... H01L 27/3276 313/504 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0250693 A1 | 10/2009 | Jeong et al. |
| 2009/0278120 A1* | 11/2009 | Lee ..................... H01L 29/7869 257/43 |
| 2009/0278122 A1 | 11/2009 | Hosono et al. |
| 2009/0280600 A1 | 11/2009 | Hosono et al. |
| 2010/0051941 A1* | 3/2010 | Tanaka ................ H01L 27/1225 257/43 |
| 2010/0065844 A1 | 3/2010 | Tokunaga |
| 2010/0092800 A1 | 4/2010 | Itagaki et al. |

(56) References Cited

U.S. PATENT DOCUMENTS

| | | | |
|---|---|---|---|
| 2010/0102313 A1 | 4/2010 | Miyairi et al. | |
| 2010/0109002 A1 | 5/2010 | Itagaki et al. | |
| 2010/0253607 A1 | 10/2010 | Shiozaki | |
| 2010/0293782 A1 | 11/2010 | Yamazaki et al. | |
| 2011/0006299 A1* | 1/2011 | Abe | H01L 21/02565 257/43 |
| 2011/0073856 A1* | 3/2011 | Sato | H01L 29/7869 257/43 |
| 2011/0084265 A1 | 4/2011 | Arasawa et al. | |
| 2011/0084267 A1 | 4/2011 | Yamazaki et al. | |
| 2011/0084268 A1 | 4/2011 | Yamazaki et al. | |
| 2011/0303911 A1 | 12/2011 | Fujii et al. | |
| 2012/0052602 A1 | 3/2012 | Hatano et al. | |
| 2012/0061652 A1 | 3/2012 | Sugisawa et al. | |
| 2016/0197166 A1 | 7/2016 | Miyairi et al. | |

FOREIGN PATENT DOCUMENTS

| | | |
|---|---|---|
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-019533 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-046081 A | 2/2003 |
| JP | 2003-086000 A | 3/2003 |
| JP | 2003-086808 A | 3/2003 |
| JP | 2003-163337 A | 6/2003 |
| JP | 2003-298062 A | 10/2003 |
| JP | 2003-299931 A | 10/2003 |
| JP | 2004-085769 A | 3/2004 |
| JP | 2004-103957 A | 4/2004 |
| JP | 2004-273614 A | 9/2004 |
| JP | 2004-273732 A | 9/2004 |
| JP | 2005-141960 A | 6/2005 |
| JP | 2006-165528 A | 6/2006 |
| JP | 2007-096055 A | 4/2007 |
| JP | 2007-123861 A | 5/2007 |
| JP | 2007-250984 A | 9/2007 |
| JP | 2008-171637 A | 7/2008 |
| JP | 2008-310312 A | 12/2008 |
| JP | 2009-503780 | 1/2009 |
| JP | 2009-026751 A | 2/2009 |
| JP | 2009-059503 A | 3/2009 |
| JP | 2009-117278 A | 5/2009 |
| JP | 2009-167087 A | 7/2009 |
| JP | 2009-182338 A | 8/2009 |
| JP | 2009-205941 A | 9/2009 |
| JP | 2010-040552 A | 2/2010 |
| JP | 2010-123938 A | 6/2010 |
| JP | 2010-177431 A | 8/2010 |
| JP | 2012-151485 A | 8/2012 |
| KR | 2003-0014150 A | 2/2003 |
| KR | 2008-0098423 A | 11/2008 |
| KR | 2010-0051485 A | 5/2010 |
| WO | 2004/114391 A1 | 12/2004 |
| WO | WO-2007/013120 | 2/2007 |
| WO | WO-2007/119321 | 10/2007 |
| WO | WO-2009/028714 | 3/2009 |
| WO | WO-2010/047217 | 4/2010 |

OTHER PUBLICATIONS

Asaoka, Y et al., "29.1: Polarizer-Free Reflective LCD Combined With Ultra Low-Power Driving Technology," SID Digest'09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Backplane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: the Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H at al., "RFCPUS on Glass and Plastic Substrates Fabricated By TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis On Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies In ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and

(56) References Cited

OTHER PUBLICATIONS

Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "SPINEL,YbFe2O4, and Yb2Fe3O7 Types of Structures for Compounds in the IN2O3 and SC2O3—A2O—-BO Systems [A; Fe, Ga, or Al; B: Mg, Mn, Fe, Nl, Cu,or Zn] at Temperatures Over 1000°C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43. No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics On Their Way To Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3—Ga2ZnO4—ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors." Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

OHara, H et al., "21.3: 4.0 In. QVGA AMOLED Display Using In—Ga—Zn-Oxide TFTS With a Novel Passivation Layer," SID Digest '09 : SID International Symposium Digest of Technical Papers, May 31, 2009, pp. 284-287.

OHara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, the Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61. No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED." AM-FPD '08 Digest of Technical Papers, Jul. 2, 2008, pp. 275-278.

(56) References Cited

OTHER PUBLICATIONS

Park. S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Korean Office Action (Application No. 2011-0087830) dated Mar. 29, 2018.

Taiwanese Office Action (Application No. 100132263) dated Nov. 14, 2017.

\* cited by examiner

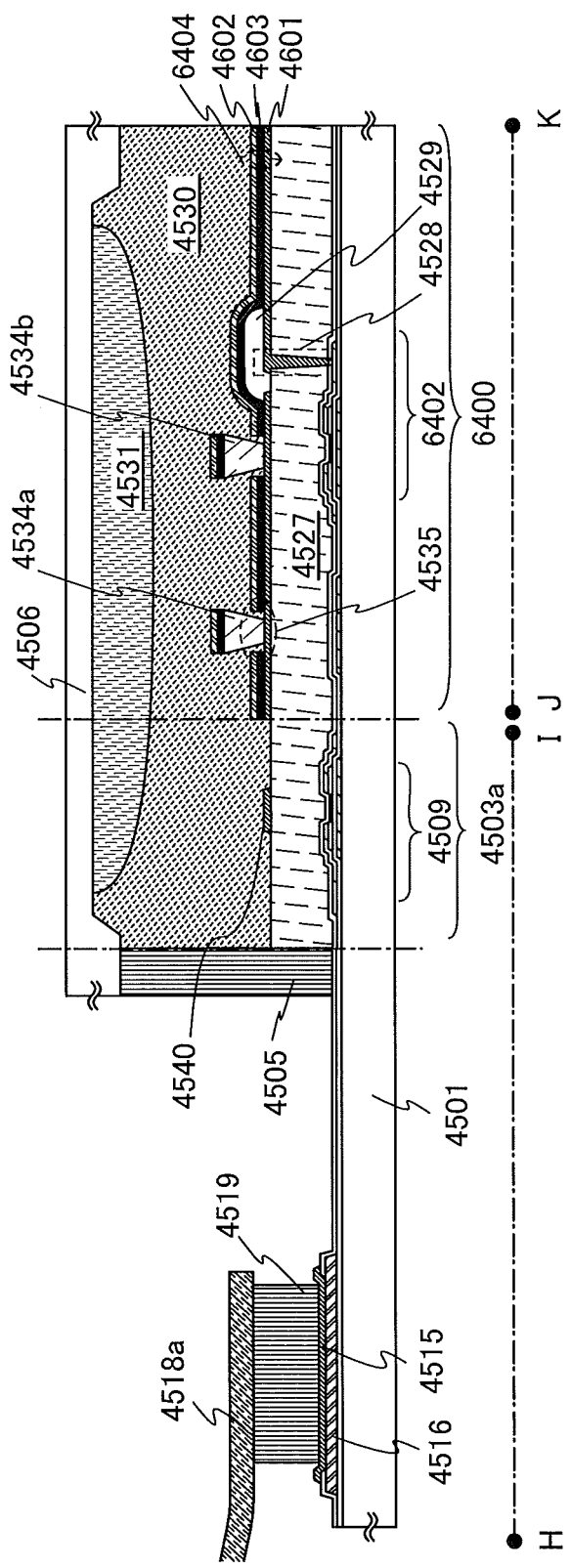

SEMICONDUCTOR DEVICE AND LIGHT-EMITTING DEVICE

CROSS-REFERENCE TO RELATED APPLICATIONS

This application is based on Japanese Patent Application serial no. 2010-203341 filed with Japan Patent Office on Sep. 10, 2010, the entire contents of which are hereby incorporated by reference.

BACKGROUND OF THE INVENTION

1. Field of the Invention

The present invention relates to a semiconductor device and a light-emitting device each of which includes an oxide semiconductor.

Note that in this specification, a semiconductor device refers to any device including a semiconductor element that functions by utilizing semiconductor properties, and semiconductor circuits, light-emitting devices, display devices, and electronic devices are all semiconductor devices.

2. Description of the Related Art

There are techniques by which a transistor is formed over a substrate having an insulating surface by using a semiconductor material such as amorphous silicon, polycrystalline silicon, or transferred single crystal silicon. While a transistor including amorphous silicon has low field-effect mobility, the transistor can be easily formed over a large glass substrate. On the other hand, while a transistor including polycrystalline silicon has relatively high field-effect mobility, the transistor requires a crystallization step such as laser annealing and is not always easy to be formed over a large glass substrate. Further, a transistor including single crystal silicon has excellent operational characteristics, but is not always easy to form over a large substrate.

In view of the foregoing, transistors including oxide semiconductors as semiconductor materials have attracted attention. For example, Patent Document 1 and Patent Document 2 disclose a technique in which a transistor is manufactured using zinc oxide or an In—Ga—Zn—O-based oxide semiconductor as a semiconductor material and such a transistor is used as a switching element or the like of an image display device.

A transistor including an oxide semiconductor for a channel formation region (also referred to as a channel region) can have a higher field-effect mobility than a transistor including amorphous silicon. In addition, an oxide semiconductor film can be easily formed over a large glass substrate by sputtering or the like, and can be formed at temperatures of 300° C. or lower. That is, a process for manufacturing a transistor including an oxide semiconductor is simpler than that for manufacturing a transistor including polycrystalline silicon.

The transistor including an oxide semiconductor can be applied to a switching element provided in a pixel portion and a transistor included in a driver circuit in a display device, for example. Note that a driver circuit in a display device includes a shift register circuit and a buffer circuit, for example, and the shift register circuit and the buffer circuit further include a logic circuit. By applying the transistor including an oxide semiconductor to a logic circuit included in a driver circuit, the driver circuit can be driven at higher speed than in the case of applying a transistor including amorphous silicon.

In addition, the logic circuit can be formed with transistors having the same conductivity type. By manufacturing a logic circuit using transistors having the same conductivity type, the process can be simplified.

Display devices such as liquid crystal displays, electroluminescent displays (also referred to as EL displays), and electronic paper have been researched and developed, using glass substrates or plastic substrates where transistors including an oxide semiconductor are formed.

REFERENCE

Patent Document

Patent Document 1: Japanese Published Patent Application No. 2007-123861
Patent Document 2: Japanese Published Patent Application No. 2007-096055

SUMMARY OF THE INVENTION

There is a problem in that a transistor having a channel formation region formed of an oxide semiconductor, which is of an enhancement (also referred to as normally-off) type, is changed into a depletion (also referred to as normally-on) type due to the use. In particular, in a semiconductor device which includes an organic layer containing a light-emitting substance between a first electrode connected to a source electrode or a drain electrode of the enhancement transistor having a channel formation region formed of an oxide semiconductor and a second electrode overlapping with the first electrode, there is a problem in that the transistor including an oxide semiconductor is changed into a depletion type over time and the reliability of the semiconductor device is reduced.

An embodiment of the present invention is made in view of the foregoing technical background. An object of one embodiment of the present invention is to provide a highly reliable semiconductor device including an oxide semiconductor. Further, an object of one embodiment of the present invention is to provide a highly reliable light-emitting device including an oxide semiconductor.

In order to achieve the aforementioned objects, the present invention focuses on a hydrogen ion and a hydrogen molecule included in a semiconductor device including an oxide semiconductor. Specifically, the present invention focuses on a hydrogen ion and a hydrogen molecule which are produced by reduction of an impurity including a hydrogen atom (e.g., moisture) with an active conductive material provided in a semiconductor device including an oxide semiconductor.

In a semiconductor device which includes an enhancement transistor that has a channel formation region formed of an oxide semiconductor and is provided over an insulating surface, and a light-emitting element in which an organic layer containing a light-emitting substance is sandwiched between a first electrode that is connected to a source electrode or a drain electrode of the transistor through an opening provided in an interlayer insulating layer over the transistor and a second electrode overlapping with the first electrode, the second electrode in the light-emitting element is sealed together with the transistor without being actively exposed to an impurity including a hydrogen atom. Therefore, the second electrode that is active against the impurity including a hydrogen atom exists in the semiconductor device in a state of not losing the activity after the sealing.

The impurity including a hydrogen atom remains in the semiconductor device including an oxide semiconductor and/or enters the semiconductor device including an oxide semiconductor from the outside. In particular, it is difficult to completely remove moisture from the semiconductor device and/or completely prevent entry of moisture from the air. Therefore, if an active conductive material capable of reducing moisture is included in a semiconductor element or a semiconductor device, the conductive material reacts with remaining moisture and/or moisture entering from the outside of the device and a hydrogen ion and/or a hydrogen molecule is produced.

The hydrogen ion and/or the hydrogen molecule produced in the semiconductor device diffuses in the semiconductor element or the semiconductor device and finally reaches the oxide semiconductor. The hydrogen ion and/or the hydrogen molecule causes an increase in the carrier concentration in the oxide semiconductor, so that characteristics of the semiconductor element including the oxide semiconductor become worse. Further, the reliability of a semiconductor device including the semiconductor element is also reduced.

In order to achieve the aforementioned objects, an adsorption layer of a hydrogen ion and/or a hydrogen molecule may be provided on the other surface side of the second electrode having one surface in contact with the organic layer.

Furthermore, an opening which a hydrogen ion and/or a hydrogen molecule passes through may be provided in the second electrode.

That is, one embodiment of the present invention is a semiconductor device which includes a first substrate over which an enhancement transistor having a channel formation region including an oxide semiconductor and a light-emitting element including a first electrode connected to a source electrode or a drain electrode of the transistor, a second electrode overlapping with the first electrode, and an organic layer containing a light-emitting substance between the first electrode and the second electrode are provided; a second substrate facing the first substrate and fixed to the first substrate with a sealant which surrounds the transistor and the light-emitting element; and an adsorption layer which adsorbs a hydrogen ion and/or a hydrogen molecule between the first substrate and the second substrate.

According to the above embodiment of the present invention, a hydrogen ion and/or a hydrogen molecule produced on the organic layer side of the second electrode moves to the adsorption layer of a hydrogen ion and/or a hydrogen molecule, which is provided on the opposite side of the second electrode. This can lower the concentration of hydrogen ions or hydrogen molecules on the organic layer side of the second electrode, which are a cause for the increase in the carrier concentration in the oxide semiconductor. As a result, characteristics of the semiconductor element including an oxide semiconductor and the reliability of a semiconductor device including the semiconductor element can be increased.

Further, one embodiment of the present invention is the semiconductor device in which the second electrode is provided with an opening which a hydrogen ion and/or a hydrogen molecule passes through.

According to the above embodiment of the present invention, a hydrogen ion and/or a hydrogen molecule produced on the organic layer side of the second electrode can easily pass through the second electrode. Accordingly, the concentration of hydrogen ions or hydrogen molecules on the organic layer side of the second electrode is lowered; therefore, characteristics of the semiconductor element including an oxide semiconductor and the reliability of a semiconductor device including the semiconductor element can be increased.

Further, one embodiment of the present invention is the semiconductor device in which the adsorption layer of a hydrogen ion and/or a hydrogen molecule includes zeolite and/or palladium.

Another embodiment of the present invention is a manufacturing method of a semiconductor device including the steps of forming an organic layer containing a light-emitting substance over a first electrode provided over a first substrate over which an enhancement transistor having a channel formation region including an oxide semiconductor and the first electrode connected to a source electrode or a drain electrode of the transistor are provided; forming a second electrode over the organic layer to form a light-emitting element; and providing an adsorption layer which adsorbs a hydrogen ion and/or a hydrogen molecule between the first substrate and a second substrate by fixing the second substrate with a sealant which surrounds the transistor and the light-emitting element so that the second substrate faces the first substrate.

Note that in this specification, an "EL layer" refers to a layer provided between a pair of electrodes in a light-emitting element. Thus, a light-emitting layer that is sandwiched between electrodes and contains an organic compound which is a light-emitting substance is an embodiment of the EL layer.

In this specification, in the case where a substance A is dispersed in a matrix formed using a substance B, the substance B forming the matrix is referred to as a host material, and the substance A dispersed in the matrix is referred to as a guest material. Note that each of the substance A and the substance B may be one substance or a mixture of two or more kinds of substances.

Note that a light-emitting device in this specification refers to an image display device, a light-emitting device, and a light source (including a lighting device). In addition, the light-emitting device includes any of the following modules in its category: a module in which a connector such as an FPC (flexible printed circuit), a TAB (tape automated bonding) tape, or a TCP (tape carrier package) is attached to a light-emitting device; a module having a TAB tape or a TCP provided with a printed wiring board at the end thereof; and a module including an IC (integrated circuit) directly mounted on a substrate over which a light-emitting element is formed by COG (chip on glass).

According to one embodiment of the present invention, a highly reliable semiconductor device including an oxide semiconductor can be provided. Further, a highly reliable light-emitting device including an oxide semiconductor can be provided.

BRIEF DESCRIPTION OF THE DRAWINGS

In the accompanying drawings:

FIG. 5 illustrates a semiconductor device according to an embodiment;

DETAILED DESCRIPTION OF THE INVENTION

Figure 1A:
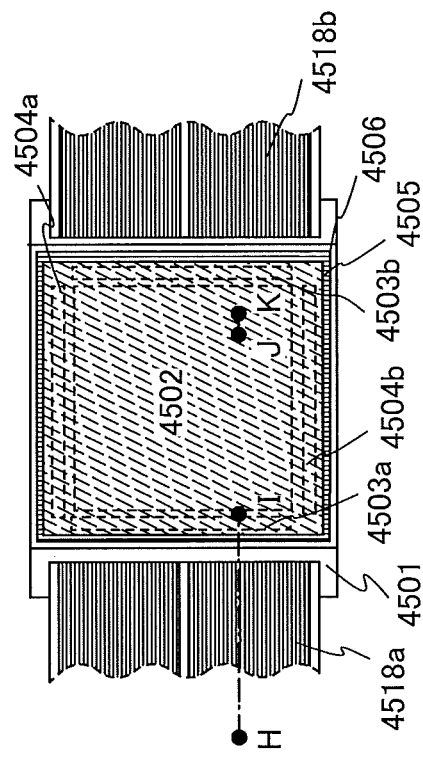
FIGS. 1A and 1B illustrate a semiconductor device according to an embodiment.

Embodiments of the present invention will be described in detail with reference to the accompanying drawings. Note that the present invention is not limited to the description below, and it is easily understood by those skilled in the art that modes and details of the present invention can be modified in various ways without departing from the spirit and scope of the present invention. Therefore, the present invention should not be interpreted as being limited to the description of the embodiments. Note that in the structures of the invention described below, the same portions or portions having similar functions are denoted by the same reference numerals in different drawings, and description of such portions is not repeated.

Embodiment 1

In this embodiment, a semiconductor device will be described. The semiconductor device includes an enhancement transistor having a channel formation region formed of an oxide semiconductor, and a light-emitting element including an organic layer containing a light-emitting substance between a first electrode connected to a source electrode or a drain electrode of the transistor through an opening provided in an interlayer insulating layer over the transistor and a second electrode overlapping with the first electrode. Further, the semiconductor device is provided with an adsorption layer of a hydrogen ion and/or a hydrogen molecule on the opposite surface side of the second electrode having one surface in contact with the organic layer. Specifically, a light-emitting display device (also referred to as a light-emitting display panel) will be described with reference to FIGS. 1A and 1B, FIGS. 2A and 2B, FIG. 3, FIG. 4, and FIG. 5.

Figure 1B:
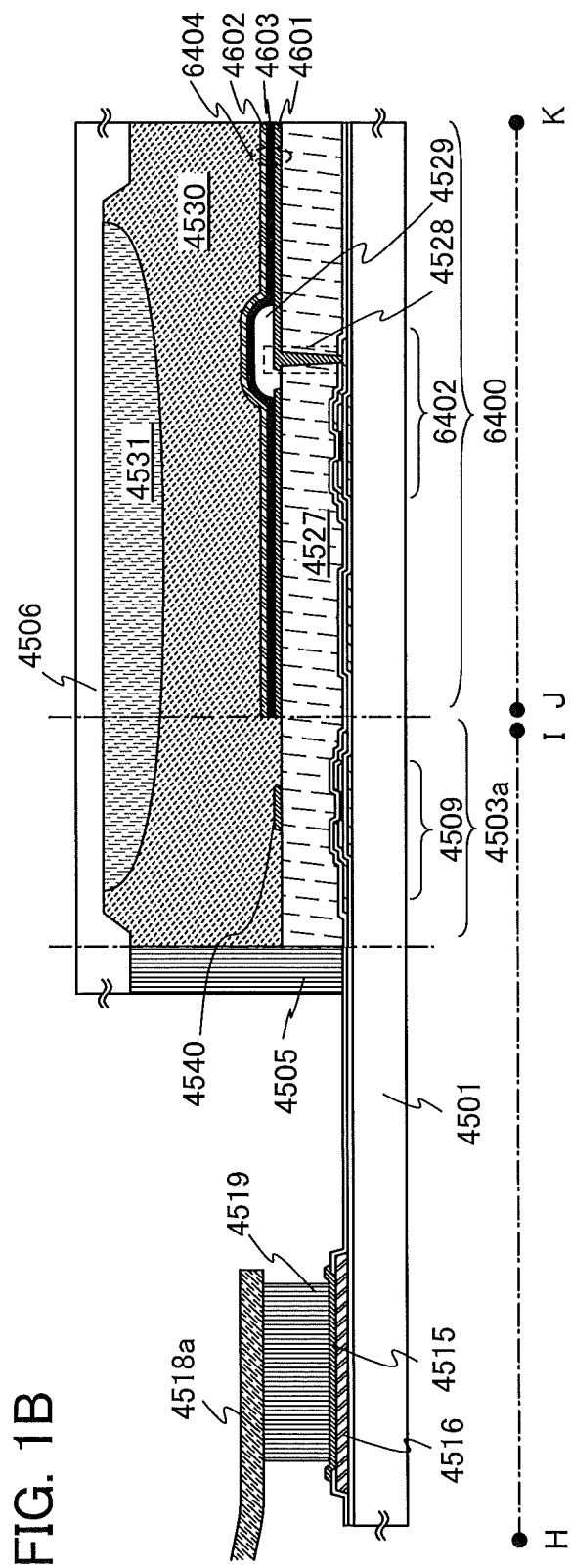

FIG. 1A is a plan view of a light-emitting display device. A cross section along line H-I and line J-K in FIG. 1A is illustrated in FIG. 1B.

The light-emitting display device described as an example in this embodiment includes a pixel portion 4502, signal line driver circuits 4503a and 4503b, and scan line driver circuits 4504a and 4504b over an insulating surface of a first substrate 4501. The pixel portion 4502, the signal line driver circuits 4503a and 4503b, and the scan line driver circuits 4504a and 4504b each include a plurality of transistors including an enhancement transistor having a channel formation region formed of an oxide semiconductor. Note that it is convenient that all of the transistors here are manufactured through the same process.

<Structure of Light-Emitting Display Device>

Figure 2A:
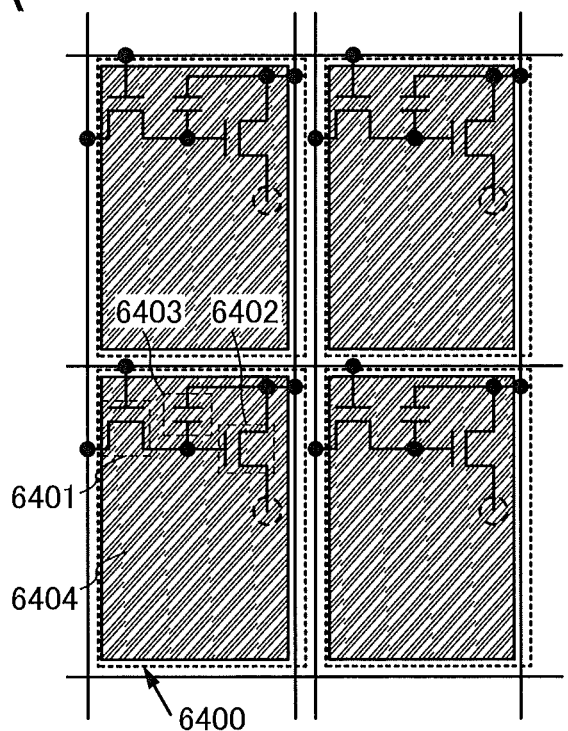
FIGS. 2A and 2B illustrate a pixel of a semiconductor device according to an embodiment.
Figure 2B:
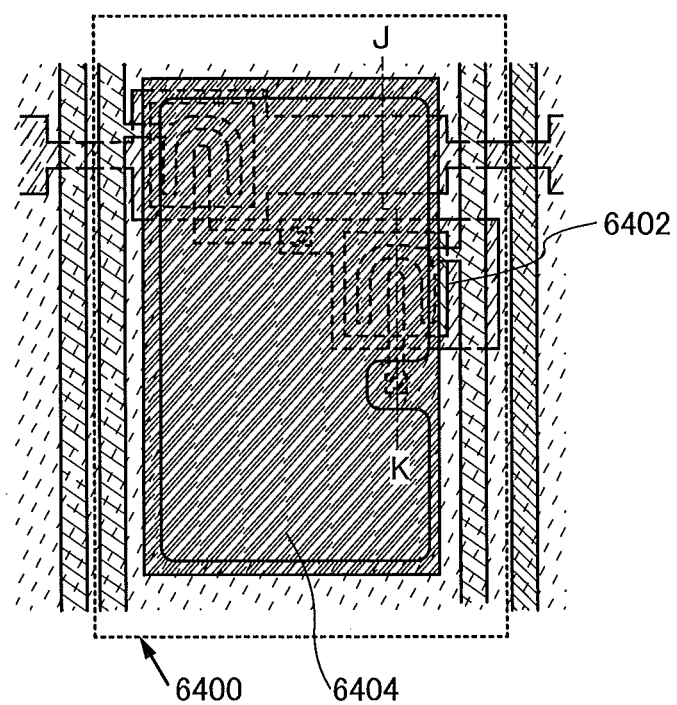

The pixel portion 4502 of the light-emitting display device described as an example in this embodiment includes a pixel 6400. An equivalent circuit and a top view of the pixel 6400 are illustrated in FIGS. 2A and 2B, respectively. The pixel 6400 includes a switching transistor 6401, a driving transistor 6402 for a light-emitting element, a light-emitting element 6404, and a capacitor 6403.

The cross-sectional structure of the pixel 6400 and the signal line driver circuit 4503a will be described with reference to FIG. 1B. Note that in FIG. 1B, the transistor 6402 provided in the pixel 6400 and a transistor 4509 provided in the signal line driver circuit 4503a are illustrated.

The transistor 4509 and the transistor 6402 formed over the first substrate 4501 are n-channel transistors and each include an oxide semiconductor layer for a channel formation region. An interlayer insulating layer 4527 is provided to cover the transistor 4509 and the transistor 6402 and eliminates unevenness formed by the transistors to make an even surface. A first electrode 4601 is formed over the interlayer insulating layer 4527 and is electrically connected to a source electrode or a drain electrode of the transistor 6402 through an opening 4528 formed in the interlayer insulating layer 4527.

A partition 4529 is formed to have an opening over the first electrode 4601 and to cover an end portion of the first electrode 4601. The partition 4529 is processed so that a side surface of the opening becomes an inclined surface with a continuous curvature. For the partition 4529, an organic resin film, an inorganic insulating film, or organopolysiloxane can be used. In particular, it is preferable to use a photosensitive material because the side surface of the opening can become an inclined surface with a continuous curvature.

A second electrode 4602 is provided over the first electrode 4601 with an organic layer 4603 containing a light-emitting substance interposed therebetween, whereby the light-emitting element 6404 is formed.

For the transistor 4509 for a driver circuit, a backgate electrode 4540 is provided over the interlayer insulating layer 4527 at a position overlapping with the channel formation region of the oxide semiconductor layer. By providing the backgate electrode 4540, the amount of change in threshold voltage of the transistor 4509 due to the bias-temperature stress test (BT test) can be reduced. Whether the potential of the backgate electrode 4540 of the transistor 4509 is the same as or different from that of a gate electrode layer, the backgate electrode 4540 functions as a second gate electrode layer. The potential of the backgate electrode 4540 may be GND or 0 V, or the backgate electrode 4540 may be in a floating state.

A variety of signals and power supply potentials for driving the light-emitting display device are supplied to the signal line driver circuits 4503a and 4503b, the scan line driver circuits 4504a and 4504b, and the pixel portion 4502 via FPCs 4518a and 4518b.

A connection terminal electrode 4515 and the first electrode 4601 are formed through the same process from the same conductive film, and a terminal electrode 4516 and a source and drain electrodes of the transistor 4509 are formed through the same process from the same conductive film. Note that the connection terminal electrode 4515 and a terminal included in the FPC 4518a are electrically connected to each other through an anisotropic conductive film 4519.

A driver circuit may be formed over a separately prepared substrate and then mounted instead of the signal line driver circuits 4503a and 4503b and the scan line driver circuits 4504a and 4504b of the light-emitting display device described as an example in this embodiment. Only the signal line driver circuits or part thereof, or only the scan line driver circuits or part thereof may be separately formed and mounted. This embodiment is not limited to the structure illustrated in FIGS. 1A and 1B.

The light-emitting element 6404 includes the organic layer 4603 containing a light-emitting substance between the first electrode 4601 and the second electrode 4602 overlapping with the first electrode 4601. The organic layer 4603 containing a light-emitting substance may include a single layer or a plurality of layers.

In this embodiment, a structure in which light emitted from the light-emitting element 6404 passes through the first substrate 4501 and is extracted to the outside is described as an example; however, the light extraction direction is not limited to this.

<Sealing Structure of Light-Emitting Display Device>

The transistors and light-emitting element formed over the first substrate 4501 are sealed by a sealant 4505 that surrounds a periphery thereof together with a filler 4530 between the first substrate 4501 and a second substrate 4506. Note that an adsorption layer 4531 of a hydrogen ion and/or a hydrogen molecule is provided between the first substrate 4501 and the second substrate 4506.

A material which has high airtightness and causes little degasification is preferably used for the first substrate 4501 and the second substrate 4506 between which the transistors and the light-emitting element are sealed. For example, glass, metal (e.g., a stainless-steel film), a moisture-resistant film, or the like can be used. For example, a protection film such as a film of plural materials attached or an ultraviolet curable resin film, or a cover material can be used. In the case of using a conductive material for the first substrate 4501, an insulating surface is formed.

As the filler 4530, an inert gas (e.g., nitrogen or argon) from which an impurity including a hydrogen atom (e.g., moisture) is removed can be used. A resin can be used as the filler 4530 instead of a gas. As examples of the resin that can be used as the filler, polyvinyl chloride (PVC), acrylic, polyimide, epoxy resin, silicone resin, polyvinyl butyral (PVB), and ethylene vinyl acetate (EVA) can be given. Alternatively, an ultraviolet curable resin or a thermosetting resin can be used.

In the light-emitting display device illustrated as an example in FIGS. 1A and 1B, the transistor 6402 and the light-emitting element 6404 are surrounded by the sealant 4505 and sealed between the first substrate 4501 and the second substrate 4506 together with the adsorption layer 4531 of a hydrogen ion and/or a hydrogen molecule provided on the second substrate 4506.

The adsorption layer 4531 of a hydrogen ion and/or a hydrogen molecule is formed of zeolite, a metal oxide, a metal (e.g., palladium) or an alloy that adsorbs hydrogen, or a drying agent that adsorbs hydrogen. In addition, a material that does not cause the release of hydrogen by reaction with water is used.

A zeolite powder dispersed into a resin can be used as well.

As the metal oxide, the same material as the oxide semiconductor that is included in the semiconductor element in the semiconductor device can be used. For example, a film containing the oxide semiconductor that is used for the channel formation region of the transistor in the semiconductor device can be formed on the second substrate 4506 and used as the adsorption layer 4531 of a hydrogen ion and/or a hydrogen molecule. The oxide semiconductor in the adsorption layer 4531 adsorbs a hydrogen ion and/or a hydrogen molecule; accordingly, a phenomenon in which a hydrogen ion and/or a hydrogen molecule diffuses into the channel formation region of the transistor can be prevented.

As a formation method of the adsorption layer, a coating method or a sputtering method can be used, for example.

In the case where a depression portion is provided for the second substrate 4506, the volume of the adsorption layer 4531 of a hydrogen ion and/or a hydrogen molecule can be increased, so that the amount of adsorption of a hydrogen ion and/or a hydrogen molecule can be increased. The increase in the amount of adsorption of a hydrogen ion and/or a hydrogen molecule can increase the reliability of the light-emitting display device.

The depression portion provided for the second substrate 4506 is convenient because not only the adsorption layer 4531 of a hydrogen ion and/or a hydrogen molecule but also a drying agent that adsorbs water vapor or oxygen can be provided in the depression portion. Further, a plurality of depression portions may be provided for the second substrate 4506, and the adsorption layer 4531 of a hydrogen ion and/or a hydrogen molecule and a drying agent that adsorbs water vapor or oxygen may be provided in different depression portions. In the case of providing the adsorption layer of a hydrogen ion and/or a hydrogen molecule and the drying agent that adsorbs water vapor or oxygen in different positions, materials that react with each other can be used for the adsorption layer and the drying agent.

Figure 3:
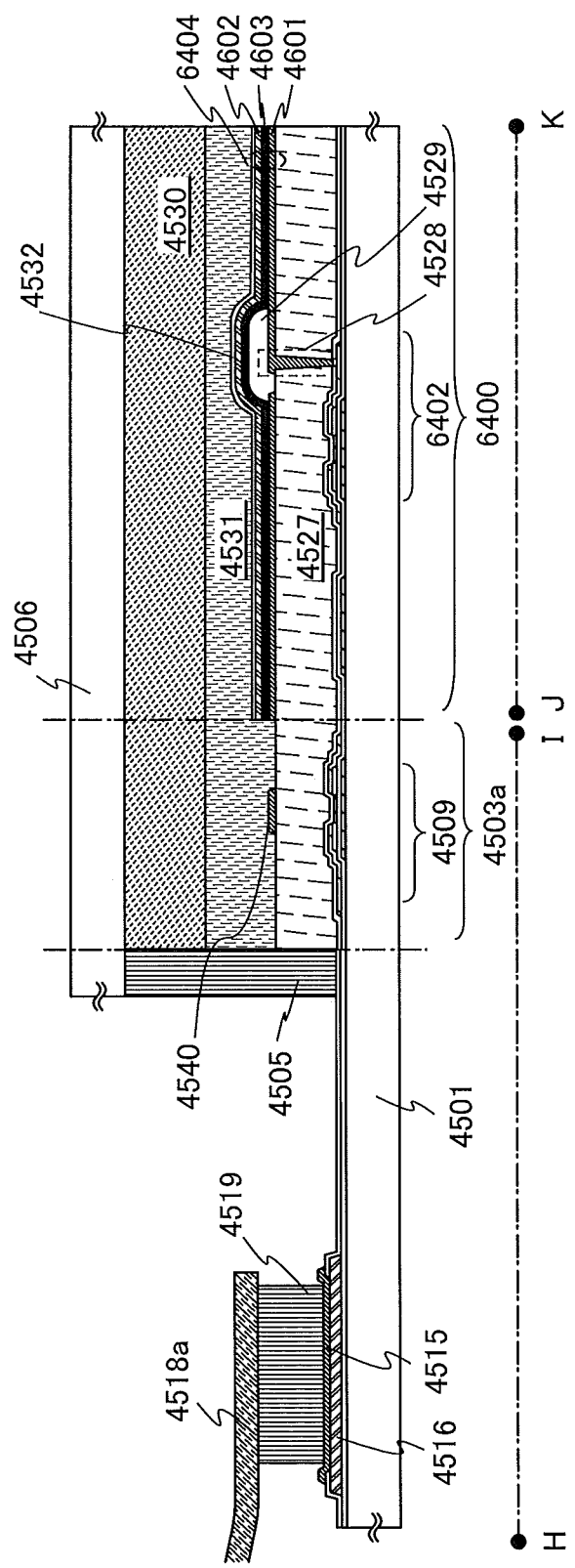
FIG. 3 illustrates a semiconductor device according to an embodiment.

A mode of a light-emitting display device, which is different from that in FIGS. 1A and 1B, will be described with reference to FIG. 3. In the light-emitting display device illustrated as an example in FIG. 3, the transistor 6402 and the light-emitting element 6404 are surrounded by the sealant 4505 and sealed together with the adsorption layer 4531 of a hydrogen ion and/or a hydrogen molecule, which is provided over the second electrode 4602 of the light-emitting element 6404 with a hydrogen-transmitting film 4532 that does not transmit moisture interposed therebetween, between the first substrate 4501 and the second substrate 4506.

As the hydrogen-transmitting film 4532, a silicon oxide film can be used, for example. It is preferable to provide the hydrogen-transmitting film 4532 that does not transmit moisture between the adsorption layer 4531 of a hydrogen ion and/or a hydrogen molecule and the second electrode 4602 because a phenomenon in which a small amount of moisture contained in the filler 4530 or the adsorption layer or moisture entering through the adsorption layer or a resin from the outside of the panel diffuses into the light-emitting element can be prevented. Note that it is also possible to directly provide the adsorption layer 4531 of a hydrogen ion and/or a hydrogen molecule on the second electrode 4602.

Here, for the adsorption layer 4531 of a hydrogen ion and/or a hydrogen molecule, any of the materials for the adsorption layer of a hydrogen ion and/or a hydrogen molecule described with reference to FIGS. 1A and 1B can be used.

Further, a protective film may be formed over the adsorption layer 4531 of a hydrogen ion and/or a hydrogen molecule. The protective film can prevent a phenomenon in which oxygen, hydrogen, moisture, carbon dioxide, or the like enters the light-emitting display device. As the protective film, a silicon nitride film, a silicon nitride oxide film, a DLC film, or the like can be used.

As the substrate positioned in the light extraction direction of the light-emitting element 6404, a substrate that transmits visible light is used. As the visible-light-transmitting substrate, a glass plate, a plastic plate, a polyester film, or an acrylic film can be used, for example.

For example, in the case of the light-emitting element 6404 having a bottom emission structure or a dual emission structure, a substrate that transmits visible light is used as the first substrate 4501. In the case of the light-emitting element

6404 having a top emission structure or a dual emission structure, a substrate that transmits visible light is used as the second substrate 4506.

The substrate positioned in the light extraction direction of the light-emitting element 6404 can be provided with an optical film as appropriate. As the optical film, a polarizing plate, a circularly polarizing plate (including an elliptically polarizing plate), a retardation plate (a quarter-wave plate or a half-wave plate), or a color filter may be provided as appropriate. Further, an anti-reflective film may be provided. For example, anti-glare treatment by which reflected light can be diffused by projections and depressions on the surface so as to reduce the glare can be performed.

<Modification Example of Sealing Structure>

A modification example of the light-emitting display devices described with reference to FIGS. 1A and 1B, FIGS. 2A and 2B, and FIG. 3 will be described. Specifically, a structure in which the second electrode 4602 of the light-emitting element 6404 is provided with an opening which a hydrogen ion and/or a hydrogen molecule passes through will be described with reference to FIG. 4.

Figure 4:
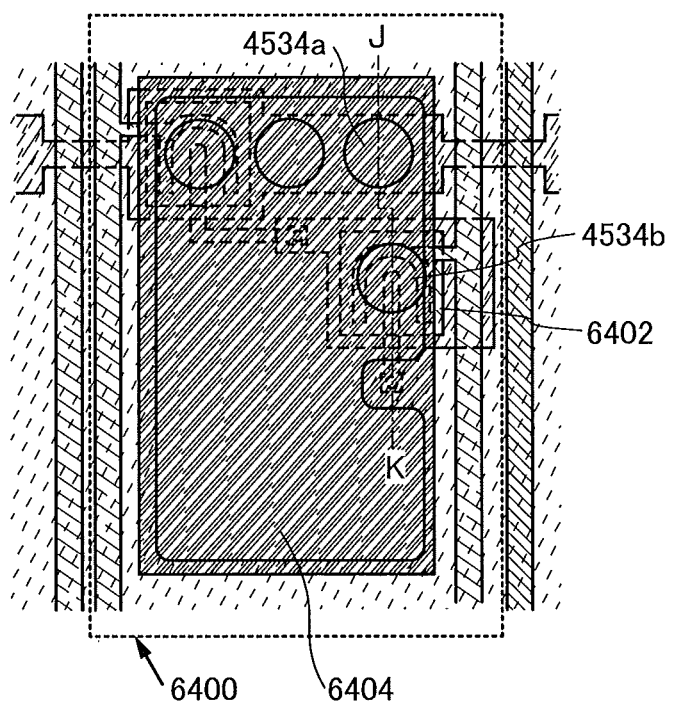
FIG. 4 illustrates a pixel of a semiconductor device according to an embodiment.

FIG. 4 is a top view of the pixel 6400 of the light-emitting display device. The pixel 6400 illustrated as an example in FIG. 4 includes, in addition to the components in the pixel 6400 illustrated as an example in FIGS. 2A and 2B, a structure body 4534a and a structure body 4534b over the first electrode 4601.

FIG. 5 is a cross-sectional view illustrating a cross section along line J-K and the like in FIG. 4. The structure body 4534a and the structure body 4534b have a reverse tapered shape. In other words, the structure body 4534a and the structure body 4534b each have a cross section that becomes larger toward an upper direction from the bottom surface in contact with the first electrode 4601. By providing such structure bodies in the pixel 6400, openings can be formed in the second electrode 4602. That is, since the structure body 4534a and the structure body 4534b each have a cross section that becomes larger toward an upper direction from the bottom surface, the vicinity of the bottom surface is shaded. Accordingly, at the time of formation of a conductive film serving as the second electrode, a region on which film formation is not performed is formed in the vicinity of the bottom surface and the region becomes the opening (e.g., an opening 4535).

Note that at the time of formation of the second electrode, an opening may be formed in the second electrode with the use of a shadow mask.

<Manufacturing Method of Light-Emitting Device>

A light-emitting element is formed in the following manner: a first substrate over which an enhancement transistor having a channel formation region formed of an oxide semiconductor, an interlayer insulating layer over the transistor, and a first electrode connected to a source electrode or a drain electrode of the transistor through an opening provided in the interlayer insulating layer are provided is used; an organic layer containing a light-emitting substance is formed over the first electrode; and a second electrode is formed over the organic layer.

A depression portion is provided for the second substrate by an etching method or a sandblasting method, and an adsorption layer of a hydrogen ion and/or a hydrogen molecule is provided for the depression portion.

A sealant is applied to such a position to surround the transistor and the light-emitting element formed over the first substrate and also to surround the depression portion provided for the second substrate. Note that the sealant is applied to at least one of the first substrate and the second substrate.

Next, the transistor, the light-emitting element, and the adsorption layer of a hydrogen ion and/or a hydrogen molecule are sealed between the first substrate and the second substrate with the use of the sealant.

In the semiconductor device which includes the enhancement transistor 6402 having a channel formation region formed of an oxide semiconductor and provided over an insulating surface and the light-emitting element 6404 including the organic layer 4603 containing a light-emitting substance between the first electrode 4601 connected to a source electrode or a drain electrode of the transistor through the opening 4528 provided in the interlayer insulating layer 4527 over the transistor and the second electrode 4602 overlapping with the first electrode 4601, the light-emitting element 6404 including the second electrode 4602 is sealed together with the transistor 6402 without being actively exposed to an impurity including a hydrogen atom after formation. Accordingly, the second electrode 4602 exists in the semiconductor device in a state of not losing the activity.

The impurity including a hydrogen atom remains in the semiconductor device including an oxide semiconductor and/or enters the semiconductor device including an oxide semiconductor from the outside. In particular, it is difficult to completely remove moisture from the semiconductor device and/or completely prevent entry of moisture from the air. Therefore, if an active conductive material capable of reducing moisture is included in a semiconductor element or a semiconductor device, the conductive material reacts with remaining moisture and/or moisture entering from the outside of the device and a hydrogen ion and/or a hydrogen molecule is produced.

The hydrogen ion and/or the hydrogen molecule produced in the semiconductor device diffuses in the semiconductor element or the semiconductor device and finally reaches the oxide semiconductor. The hydrogen ion and/or the hydrogen molecule causes an increase in the carrier concentration in the oxide semiconductor, so that characteristics of the semiconductor element including the oxide semiconductor become worse. Further, the reliability of a semiconductor device including the semiconductor element is also reduced.

In the display devices described in this embodiment, that is, in the light-emitting display devices each provided with an adsorption layer of a hydrogen ion and/or a hydrogen molecule on the opposite surface side of the second electrode 4602 having one surface in contact with the organic layer 4603 containing a light-emitting substance, a hydrogen ion and/or a hydrogen molecule produced on the organic layer side of the second electrode 4602 moves to the adsorption layer of a hydrogen ion and/or a hydrogen molecule, which is provided on the opposite side of the second electrode 4602. This can lower the concentration of hydrogen ions and/or hydrogen molecules, which are a cause for the increase in the carrier concentration in the oxide semiconductor, in a region where the semiconductor element including an oxide semiconductor is provided on the organic layer side of the second electrode 4602. As a result, characteristics of the semiconductor element including an oxide semiconductor and the reliability of a semiconductor device including the semiconductor element can be increased.

When an opening (e.g., the opening 4535) which a hydrogen ion and/or a hydrogen molecule passes through is provided in the second electrode, a hydrogen ion and/or a hydrogen molecule produced on the organic layer side of the second electrode can easily pass through the second electrode. This can lower the concentration of hydrogen ions and/or hydrogen molecules in the region where the semiconductor element including an oxide semiconductor is provided on the organic layer side of the second electrode; therefore, characteristics of the semiconductor element including an oxide semiconductor and the reliability of a semiconductor device including the semiconductor element can be increased.

This embodiment can be combined with any of the other embodiments in this specification as appropriate.

Embodiment 2

In this embodiment, an enhancement transistor having a channel formation region formed of an oxide semiconductor will be described. An enhancement transistor having a channel formation region formed of an oxide semiconductor includes a gate electrode on one side of a gate insulating film, an oxide semiconductor layer on the other side of the gate insulating film, and a source electrode and a drain electrode which are in contact with the oxide semiconductor layer and whose end portions overlap with the gate electrode. In this embodiment, as an example of an enhancement transistor having a channel formation region formed of an oxide semiconductor, an example of a structure and a manufacturing method of an inverted staggered transistor including an oxide semiconductor will be described with reference to FIGS. 6A to 6E. Note that the transistor is not limited to an inverted staggered transistor, and the transistor may be a staggered transistor, a coplanar transistor, or an inverted coplanar transistor and may have a channel-etched structure or a channel protective structure.

Note that the transistor described in this embodiment can be used in the semiconductor device described in Embodiment 1.

<Step 1: Formation of Transistor>

FIGS. 6A to 6E illustrate an example of a cross-sectional structure of a transistor having a channel formation region formed of an oxide semiconductor. A transistor illustrated in FIGS. 6A to 6E is an inverted staggered transistor with a bottom-gate structure.

An oxide semiconductor used for a semiconductor layer in this embodiment is made to be an i-type (intrinsic) oxide semiconductor or made to be extremely close to an i-type (intrinsic) oxide semiconductor by being purified by removing hydrogen, which is an n-type impurity, from the oxide semiconductor so that impurities that are not main components of the oxide semiconductor are contained as little as possible.

Note that the purified oxide semiconductor has extremely few carriers, and the carrier concentration is lower than $1 \times 10^{14}/cm^3$, preferably lower than $1 \times 10^{12}/cm^3$, further preferably lower than $1 \times 10^{11}/cm^3$. Such few carriers enable a current in an off state (off-state current) to be low enough.

Specifically, in the transistor including the oxide semiconductor layer, the leakage current (off-state current) per micrometer of a channel width between the source and the drain in an off state can be less than or equal to 100 zA ($1 \times 10^{-19}$ A) or less than or equal to 10 zA ($1 \times 10^{-20}$ A), and further can be less than or equal to 1 zA ($1 \times 10^{-21}$ A) with a source-drain voltage of 3.5 V at ambient temperature (e.g., 25° C.).

In the transistor including the purified oxide semiconductor layer, the temperature dependence of on-state current is hardly observed, and the off-state current remains extremely low at high temperatures.

Steps of manufacturing the transistor having a channel formation region formed of an oxide semiconductor over a substrate 505 will be described below with reference to FIGS. 6A to 6E. Note that in a step using a resist mask, a resist mask may be formed by an inkjet method. Formation of the resist mask by an inkjet method needs no photomask; thus, manufacturing costs can be reduced.

<1-1. Substrate Having Insulating Surface>

First, a conductive film is formed over the substrate 505 having an insulating surface, and then a gate electrode layer 511 is formed in a first photolithography process.

There is no particular limitation on the substrate 505 as long as the substrate 505 has an insulating surface and has gas barrier properties to water vapor and hydrogen gas; the substrate 505 needs to have heat resistance at least high enough to withstand heat treatment in the case where the heat treatment is performed in a later step. For example, a glass substrate of barium borosilicate glass, aluminoborosilicate glass, or the like, a quartz substrate, a sapphire substrate, a ceramic substrate, or the like can be used. Alternatively, a metal substrate containing stainless steel or a semiconductor substrate having an insulating film formed on its surface may be used. A flexible substrate formed of a synthetic resin such as plastics generally tends to have a lower upper temperature limit than the above substrates; such a substrate can be used as long as it can withstand processing temperature in manufacturing steps. Note that the surface of the substrate 505 may be planarized by polishing such as CMP.

In this embodiment, a glass substrate is used as the substrate 505 having an insulating surface.

Note that an insulating layer serving as a base may be provided between the substrate 505 and the gate electrode layer 511. The insulating layer has a function of preventing diffusion of an impurity element from the substrate 505, and can be formed with a single layer structure or a stacked-layer structure including one or more films selected from a silicon nitride film, a silicon oxide film, a silicon nitride oxide film, a silicon oxynitride film, and the like.

<1-2. Gate Electrode Layer>

The gate electrode layer 511 can be formed with a single-layer structure or a stacked-layer structure using a metal material such as molybdenum, titanium, chromium, tantalum, tungsten, neodymium, or scandium or an alloy material containing any of these materials as its main component. Note that aluminum or copper can also be used as the metal material if it can withstand the temperature of heat treatment to be performed in a later step. Aluminum or copper is preferably combined with a refractory metal material so as to prevent problems of heat resistance and corrosion. As the refractory metal material, molybdenum, titanium, chromium, tantalum, tungsten, neodymium, scandium, or the like can be used.

<1-3. Gate Insulating Layer>

Next, a gate insulating layer 507 is formed over the gate electrode layer 511. The gate insulating layer 507 can be formed using plasma CVD, sputtering, or the like. Moreover, the gate insulating layer 507 can be formed with a single-layer structure or a stacked-layer structure using one or more films selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, a tantalum oxide film, a gallium oxide film, and the like.

For the oxide semiconductor in this embodiment, an oxide semiconductor that is made to be an i-type semiconductor or a substantially i-type semiconductor by removing impurities (i.e., a purified oxide semiconductor) is used. Such a purified oxide semiconductor is highly sensitive to an interface state and interface charge; thus, the interface between the oxide semiconductor layer and the gate insulating layer is important. For that reason, the gate insulating layer that is to be in contact with a purified oxide semiconductor needs to have high quality.

For example, high-density plasma CVD using microwaves (e.g., with a frequency of 2.45 GHz) is preferably employed because a dense insulating layer with high withstand voltage and high quality can be formed. The purified oxide semiconductor and the high-quality gate insulating layer are in close contact with each other, whereby the interface state density can be reduced to obtain favorable interface characteristics.

Needless to say, another film formation method such as sputtering or plasma CVD can be employed as long as the method enables formation of a good-quality insulating layer as the gate insulating layer. Further, an insulating layer whose film quality and characteristics of the interface with an oxide semiconductor are improved by heat treatment performed after formation of the insulating layer may be formed as the gate insulating layer. In any case, any insulating layer may be used as long as the insulating layer has characteristics of reducing interface state density between the insulating layer and an oxide semiconductor and forming a favorable interface as well as having favorable film quality as the gate insulating layer.

The gate insulating layer 507 is to be in contact with an oxide semiconductor layer formed later. Since semiconductor characteristics are impaired when hydrogen diffuses into the oxide semiconductor layer, it is preferable that the gate insulating layer 507 do not contain hydrogen, a hydroxyl group, and moisture. In order that hydrogen, a hydroxyl group, and moisture might be contained in the gate insulating layer 507 and an oxide semiconductor film 530 as little as possible, it is preferable that the substrate 505 over which the gate electrode layer 511 is formed or the substrate 505 over which layers up to and including the gate insulating layer 507 are formed be preheated in a preheating chamber of a sputtering apparatus as pretreatment for deposition of the oxide semiconductor film 530 so that impurities such as hydrogen and moisture adsorbed to the substrate 505 are eliminated and removed. The temperature for the preheating ranges from 100° C. to 400° C., preferably from 150° C. to 300° C. As an exhaustion unit provided in the preheating chamber, a cryopump is preferable. Note that this preheating treatment can be omitted. This preheating step may be similarly performed on the substrate 505 over which layers up to and including a source electrode layer 515a and a drain electrode layer 515b are formed before formation of a first insulating layer 516.

<1-4. Oxide Semiconductor Layer>

Figure 6A:
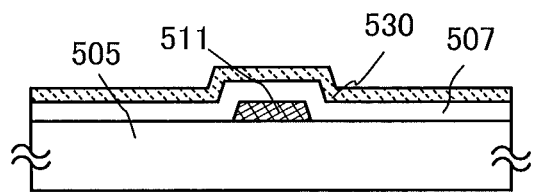
FIGS. 6A to 6E illustrate a manufacturing process of a semiconductor device according to an embodiment.

Next, the oxide semiconductor film 530 with a thickness of 2 nm to 200 nm, preferably 5 nm to 30 nm is formed over the gate insulating layer 507 (see FIG. 6A).

The oxide semiconductor film is formed by sputtering using an oxide semiconductor target. Further, the oxide semiconductor film can be formed by sputtering under a rare gas (e.g., argon) atmosphere, an oxygen atmosphere, or a mixed atmosphere of a rare gas (e.g., argon) and oxygen.

Note that before the oxide semiconductor film 530 is formed by sputtering, powdery substances (also referred to as particles or dust) attached to a surface of the gate insulating layer 507 are preferably removed by reverse sputtering in which plasma is generated by introduction of an argon gas. The reverse sputtering refers to a method in which an RF power supply is used for application of voltage to a substrate side in an argon atmosphere and plasma is generated around the substrate to modify a surface. Note that instead of an argon atmosphere, a nitrogen atmosphere, a helium atmosphere, an oxygen atmosphere, or the like may be used.

As an oxide semiconductor used for the oxide semiconductor film 530, any of the following metal oxides can be used, for example: an oxide of four metal elements, such as an In—Sn—Ga—Zn—O-based oxide semiconductor; oxides of three metal elements, such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor; oxides of two metal elements, such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based oxide semiconductor; an In—O-based oxide semiconductor, a Sn—O-based oxide semiconductor, and a Zn—O-based oxide semiconductor. Further, the oxide semiconductor layer may contain silicon oxide. Addition of silicon oxide ($SiO_x$ ($x>0$)) which hinders crystallization into the oxide semiconductor layer can suppress crystallization of the oxide semiconductor layer at the time when heat treatment is performed in the manufacturing process after formation of the oxide semiconductor layer. The oxide semiconductor layer preferably exists in an amorphous state; alternatively, the oxide semiconductor layer may be partly crystallized. Here, for example, an In—Ga—Zn—O-based oxide semiconductor means an oxide film containing indium (In), gallium (Ga), and zinc (Zn), and there is no particular limitation on the composition ratio. The In—Ga—Zn—O-based oxide semiconductor may contain an element other than In, Ga, and Zn.

In addition, for the oxide semiconductor film 530, a thin film of a material represented by the chemical formula of $InMO_3(ZnO)_m$ (m>0) can be used. Here, M represents one or more metal elements selected from Ga, Al, Mn, and Co. For example, M can be Ga, Ga and Al, Ga and Mn, or Ga and Co.

The oxide semiconductor preferably includes In, and further preferably includes In and Ga. In order to obtain an i-type (intrinsic) oxide semiconductor layer, dehydration or dehydrogenation is effective. In this embodiment, the oxide semiconductor film 530 is deposited by sputtering with the use of an In—Ga—Zn—O-based oxide semiconductor target. A cross-sectional view at this stage corresponds to FIG. 6A.

As the target for forming the oxide semiconductor film 530 by sputtering, for example, an oxide target having a composition ratio of $In_2O_3:Ga_2O_3:ZnO=1:1:1$ [molar ratio] is used to form an In—Ga—Zn—O film. Without limitation to the material and the composition of the above target, an oxide target having a composition ratio of $In_2O_3:Ga_2O_3:ZnO=1:1:2$ [molar ratio] or $In_2O_3:Ga_2O_3:ZnO=1:1:4$ [molar ratio] may be used, for example.

Furthermore, the filling rate of the oxide target is 90% to 100%, preferably 95% to 99.9%. With use of the metal oxide target with a high filling rate, a dense oxide semiconductor film can be formed.

It is preferable that a high-purity gas from which impurities such as hydrogen, water, a hydroxyl group, or a hydride have been removed be used as a sputtering gas used for the formation of the oxide semiconductor film 530.

The substrate is held in a deposition chamber kept under reduced pressure, and the substrate temperature is set in the range of 100° C. to 600° C., preferably 200° C. to 400° C. By forming the oxide semiconductor film while the substrate is heated, the concentration of impurities included in the formed oxide semiconductor film can be reduced. In addition, damage by sputtering is reduced. Then, a sputtering gas from which hydrogen and moisture have been removed is introduced into the deposition chamber while moisture remaining therein is removed, and the oxide semiconductor film 530 is formed over the substrate 505 with the use of the above target. In order to remove moisture remaining in the deposition chamber, an entrapment vacuum pump such as a cryopump, an ion pump, or a titanium sublimation pump is preferably used. The evacuation unit may be a turbo pump provided with a cold trap. In the deposition chamber evacuated with the cryopump, a hydrogen atom, a compound containing a hydrogen atom, such as water ($H_2O$) (preferably, also a compound containing a carbon atom), and the like are removed, whereby the concentration of impurities in the oxide semiconductor film formed in the deposition chamber can be reduced.

The atmosphere for sputtering may be a rare gas (typically, argon) atmosphere, an oxygen atmosphere, or a mixed atmosphere containing a rare gas and oxygen.

As one example of the deposition conditions, the distance between the substrate and the target is 100 mm, the pressure is 0.6 Pa, the direct-current (DC) power is 0.5 kW, and the atmosphere is an oxygen atmosphere (the proportion of the oxygen flow rate is 100%). Note that a pulsed direct-current power source is preferably used, in which case powder substances (also referred to as particles or dust) generated in deposition can be reduced and the film thickness can be uniform.

Note that impurities, for example, an alkali metal such as Li, Na or K and an alkaline earth metal such as Ca contained in the oxide semiconductor layer are preferably small in amount. Specifically, it is preferable that the concentration of Li detected by SIMS be lower than or equal to $5\times10^{15}$ $cm^{-3}$, preferably lower than or equal to $1\times10^{15}$ $cm^{-3}$, and the concentration of K be lower than or equal to $5\times10^{15}$ $cm^{-3}$, preferably lower than or equal to $1\times10^{15}$ $cm^{-3}$.

An alkali metal and an alkaline earth metal are adverse impurities for the oxide semiconductor and are preferably contained as little as possible. When an insulating film in contact with the oxide semiconductor is an oxide, an alkali metal, in particular, Na diffuses into the oxide and becomes $Na^+$. In addition, Na cuts a bond between metal and oxygen or enters the bond in the oxide semiconductor. As a result, transistor characteristics deteriorate (e.g., the transistor becomes normally-on (the threshold voltage shifts negatively) or the mobility is decreased). In addition, this also causes variation in the characteristics. Such a problem is significant especially in the case where the hydrogen concentration in the oxide semiconductor is extremely low. Therefore, the concentration of an alkali metal is strongly required to set to the above value in the case where the hydrogen concentration in the oxide semiconductor is lower than or equal to $5\times10^{19}$ $cm^3$, particularly lower than or equal to $5\times10^{18}$ $cm^{-3}$.

Next, the oxide semiconductor film 530 is processed into an island-shaped oxide semiconductor layer in a second photolithography process.

In the case where a contact hole is formed in the gate insulating layer 507, a step of forming the contact hole can be performed at the same time as processing of the oxide semiconductor film 530.

Note that etching of the oxide semiconductor film 530 may be dry etching, wet etching, or both dry etching and wet etching. As an etchant used for wet etching for the oxide semiconductor film 530, a mixed solution of phosphoric acid, acetic acid, and nitric acid can be used, for example. In addition, ITO07N (produced by Kanto Chemical Co., Inc.) may be used.

As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the films into desired shapes, the etching conditions (e.g., the amount of electric power applied to a coil-shaped electrode, the amount of electric power applied to an electrode on a substrate side, and the temperature of the electrode on the substrate side) are adjusted as appropriate.

Next, the oxide semiconductor layer is subjected to first heat treatment. The oxide semiconductor layer can be dehydrated or dehydrogenated by this first heat treatment. The temperature of the first heat treatment is higher than or equal to 250° C. and lower than or equal to 750° C., preferably higher than or equal to 400° C. and lower than the strain point of the substrate. For example, heat treatment may be performed at 500° C. for approximately 3 minutes to 6 minutes. By using a rapid thermal annealing (RTA) method for the heat treatment, dehydration or dehydrogenation can be performed in a short time; therefore, the treatment can be performed even at a temperature higher than the strain point of a glass substrate.

Figure 6B:
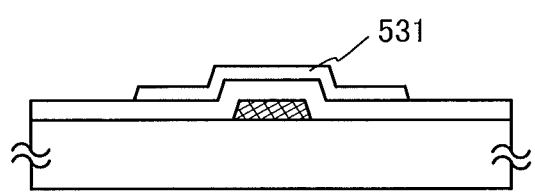

Here, the substrate is put in an electric furnace which is one of heat treatment apparatuses and heat treatment is performed on the oxide semiconductor layer at 450° C. for one hour in a nitrogen atmosphere, and then, the oxide semiconductor layer is not exposed to the air so that entry of water and hydrogen into the oxide semiconductor layer is prevented; thus, an oxide semiconductor layer 531 is obtained (see FIG. 6B).

Note that a heat treatment apparatus used is not limited to an electric furnace, and a device for heating an object to be processed by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object by heat treatment, such as nitrogen or a rare gas like argon, is used.

For example, as the first heat treatment, GRTA may be performed as follows: the substrate is moved into an inert gas heated to a temperature as high as 650° C. to 700° C., heated for several minutes, and moved out of the inert gas heated to the high temperature.

Note that in the first heat treatment, it is preferable that water, hydrogen, and the like be not contained in the atmosphere of nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (i.e., the concentration of impurities is 1 ppm or lower, preferably 0.1 ppm or lower).

In addition, after the oxide semiconductor layer is heated by the first heat treatment, a high-purity oxygen gas, a high-purity $N_2O$ gas, or ultra-dry air (the moisture amount is less than or equal to 20 ppm (−55° C. by conversion into a dew point), preferably less than or equal to 1 ppm, more preferably less than or equal to 10 ppb, in the case where measurement is performed with the use of a dew point meter of a cavity ring down laser spectroscopy (CRDS) system) may be introduced into the same furnace. It is preferable that the oxygen gas and the $N_2O$ gas do not include water, hydrogen, and the like. Alternatively, the purity of the oxygen gas or the $N_2O$ gas that is introduced into the heat treatment apparatus is preferably 6N or higher, more preferably 7N or higher (i.e., the concentration of impurities in the oxygen gas or the $N_2O$ gas is preferably 1 ppm or lower, more preferably 0.1 ppm or lower). Oxygen which is a main component of the oxide semiconductor and has been reduced because of the step of removing impurities through the dehydration or the dehydrogenation is supplied with the use of the effect of an oxygen gas or an $N_2O$ gas, whereby the purity of the oxide semiconductor layer is increased and the oxide semiconductor layer is made to be electrically i-type (intrinsic).

In addition, the first heat treatment for the oxide semiconductor layer can also be performed on the oxide semiconductor film 530 which has not been processed into the island-shaped oxide semiconductor layer. In that case, the substrate is taken out from the heat apparatus after the first heat treatment, and then a photolithography process is performed.

Note that the first heat treatment may be performed at either of the following timings without limitation to the above-described timing as long as it is performed after the oxide semiconductor layer is formed: after a source electrode layer and a drain electrode layer are formed over the oxide semiconductor layer; and after an insulating layer is formed over the source electrode layer and the drain electrode layer.

In the case where a contact hole is formed in the gate insulating layer 507, the formation of the contact hole may be performed before or after the first heat treatment is performed on the oxide semiconductor film 530.

Through the above-described steps, the concentration of hydrogen in the island-shaped oxide semiconductor layer can be reduced and the island-shaped oxide semiconductor layer can be purified. Thus, the oxide semiconductor layer can be stable. In addition, heat treatment at a temperature that is lower than or equal to the glass transition temperature makes it possible to form an oxide semiconductor layer with extremely low carrier density and a wide band gap. Therefore, the transistor can be manufactured using a large substrate, so that the productivity can be increased. In addition, by using the oxide semiconductor layer in which the hydrogen concentration is reduced and the purity is improved, it is possible to manufacture a transistor with high withstand voltage and an extremely low off-state current. The above heat treatment can be performed at any time as long as it is performed after the oxide semiconductor layer is formed.

In addition, as the oxide semiconductor layer, an oxide semiconductor layer having a crystal region with a large thickness (a single crystal region), that is, a crystal region that is c-axis-aligned perpendicularly to a surface of the film may be formed by performing deposition twice and heat treatment twice, regardless of the material of a base component such as oxide, nitride, metal, or the like. For example, a first oxide semiconductor film with a thickness 3 nm to 15 nm is formed and then first heat treatment is performed at temperatures ranging from 450° C. to 850° C., preferably from 550° C. to 750° C. in an atmosphere of nitrogen, oxygen, a rare gas, or dry air, whereby a first oxide semiconductor film that has a crystal region (including plate-like crystals) in a region including its surface is formed. Then, a second oxide semiconductor film that is thicker than the first oxide semiconductor film is formed and then second heat treatment is performed at temperatures ranging from 450° C. to 850° C., preferably from 600° C. to 700° C., so that crystal growth proceeds upward with the use of the first oxide semiconductor film as a seed of the crystal growth. Thus, the entire second oxide semiconductor film is crystallized. In such a manner, an oxide semiconductor layer that includes a thick crystal region may be formed.

<1-5. Source Electrode Layer and Drain Electrode Layer>

Next, a conductive film that serves as a source electrode layer and a drain electrode layer (as well as a wiring) is formed over the gate insulating layer 507 and the oxide semiconductor layer 531. As the conductive film serving as the source electrode layer and the drain electrode layer, for example, a metal film including an element selected from Al, Cr, Cu, Ta, Ti, Mo, and W, an alloy film including any of the above elements as its component, or a metal nitride film (e.g., a titanium nitride film, a molybdenum nitride film, or a tungsten nitride film) can be used. In addition, in order to avoid problems of heat resistance and corrosion, a film of refractory metal such as Ti, Mo, W, Cr, Ta, Nd, Sc, or Y or a metal nitride film thereof (e.g., a titanium nitride film, a molybdenum nitride film, or a tungsten nitride film) may be stacked on one or both of the bottom side and the top side of a metal film of Al, Cu, or the like.

Further, the conductive film may have a single-layer structure or a stacked-layer structure of two or more layers. For example, the conductive film may have a single-layer structure of an aluminum film containing silicon; a two-layer structure of an aluminum film and a titanium film stacked thereover; or a three-layer structure in which a titanium film, an aluminum film, and a titanium film are stacked in this order.

Alternatively, the conductive film may be formed using conductive metal oxide. As the conductive metal oxide, indium oxide, tin oxide, zinc oxide, an alloy of indium oxide and tin oxide, an alloy of indium oxide and zinc oxide, or the conductive metal oxide material containing silicon or silicon oxide can be used.

Note that in the case where heat treatment is performed after the conductive film is formed, the conductive film preferably has heat resistance high enough to withstand the heat treatment.

Figure 6C:
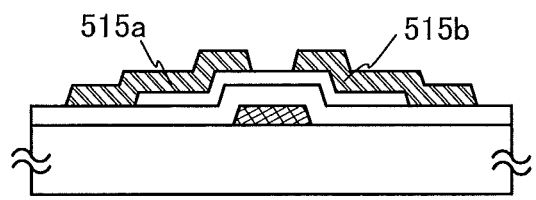

Then, a resist mask is formed over the conductive film in a third photolithography process, and the source electrode layer 515a and the drain electrode layer 515b are formed by selective etching, and then, the resist mask is removed (see FIG. 6C).

It is preferable to use ultraviolet light, KrF laser light, or ArF laser light for light exposure at the time of the formation of the resist mask in the third photolithography process. The channel length L of a transistor that is completed later is determined by a distance between bottom edges of the source electrode layer and the drain electrode layer, which are adjacent to each other over the oxide semiconductor layer 531. In the case where the channel length L is less than 25 nm, light exposure at the time of the formation of the resist mask in the third photolithography process is preferably performed using extreme ultraviolet light having an extremely short wavelength of several nanometers to several tens of nanometers. In the light exposure by extreme ultraviolet light, the resolution is high and the focus depth is large. Thus, the channel length L of the transistor that is completed later can be 10 nm to 1000 nm, and the operation speed of a circuit can be increased.

Note that it is preferable that etching conditions be optimized so as not to etch and divide the oxide semiconductor layer 531 when the conductive film is etched. However, it is difficult to obtain conditions under which only the conductive film is etched and the oxide semiconductor layer 531 is not etched at all. In some cases, only part of the oxide semiconductor layer 531 is etched at the time of etching of the conductive film and a groove (a depression portion) is formed in the oxide semiconductor layer.

In this embodiment, an ammonia hydrogen peroxide mixture (a mixed solution of ammonia, water, and a hydrogen peroxide solution) is used as an etchant since a Ti film is used as the conductive film and an In—Ga—Zn—O-based oxide semiconductor is used for the oxide semiconductor layer 531. When the ammonia hydrogen peroxide mixture is used as an etchant, the conductive film can be selectively etched.

<1-6. Insulating Layer for Protection>

Next, plasma treatment using a gas such as $N_2O$, $N_2$, or Ar may be performed to remove water or the like adsorbed to an exposed surface of the oxide semiconductor layer. Plasma treatment may be performed using a mixture gas of oxygen and argon. In the case where the plasma treatment is performed, the first insulating layer 516 serving as a protective insulating layer in contact with part of the oxide semiconductor layer is formed without exposure to the air.

The first insulating layer 516 preferably contains as few impurities such as moisture, hydrogen, and oxygen as possible, and may be formed using a single-layer insulating film or a stack of a plurality of insulating films. Further, the first insulating layer 516 can be formed to a thickness of at least 1 nm by a method in which impurities such as water and hydrogen do not enter the first insulating layer 516, such as sputtering. When hydrogen is contained in the first insulating layer 516, hydrogen may enter the oxide semiconductor layer or extract oxygen from the oxide semiconductor layer, which causes a reduction in resistance of a back channel of the oxide semiconductor layer (i.e., makes an n-type back channel), so that a parasitic channel might be formed. Therefore, it is important for the first insulating layer 516 that hydrogen is not used in the formation method in order to contain hydrogen as little as possible.

The first insulating layer 516 is preferably formed using a material having high barrier properties. For example, a silicon nitride film, a silicon nitride oxide film, an aluminum nitride film, an aluminum nitride oxide film, an aluminum oxide film, or a gallium oxide film can be used as the insulating film having high barrier properties. By using the insulating film with high barrier properties, impurities such as moisture or hydrogen can be prevented from entering the island-shaped oxide semiconductor layer, the gate insulating layer, or the interface between the island-shaped oxide semiconductor layer and another insulating layer and the vicinity thereof.

For example, it is possible to form an insulating film having a structure in which a 100-nm-thick aluminum oxide film formed by sputtering is stacked over a 200-nm-thick gallium oxide film formed by sputtering. The substrate temperature at the time of deposition is in the range of room temperature to 300° C. Further, the insulating film preferably contains a large amount of oxygen, and the proportion of oxygen in the insulating film is preferably higher than the stoichiometric proportion, further preferably more than 1 time and less than 2 times the stoichiometric proportion. When the insulating film thus contains excessive oxygen, oxygen is supplied to the interface with the island-shaped oxide semiconductor film, so that oxygen vacancies can be reduced.

In this embodiment, a 200-nm-thick silicon oxide film is formed as the first insulating layer 516 by sputtering. The substrate temperature in film formation may be higher than or equal to room temperature and lower than or equal to 300° C. and in this embodiment, is 100° C. The silicon oxide film can be formed by sputtering in a rare gas (typically, argon) atmosphere, an oxygen atmosphere, or a mixed atmosphere of a rare gas and oxygen. As a target, a silicon oxide target or a silicon target can be used. For example, the silicon oxide film can be formed using a silicon target by sputtering in an atmosphere containing oxygen. As the first insulating layer 516 which is formed in contact with the oxide semiconductor layer, an inorganic insulating film that does not include impurities such as moisture, a hydrogen ion, and $OH^-$ and blocks entry of these from the outside is used. Typically, a silicon oxide film, a silicon oxynitride film, an aluminum oxide film, an aluminum oxynitride film, or the like is used.

As in the case of formation of the oxide semiconductor film 530, an entrapment vacuum pump (e.g., a cryopump) is preferably used in order to remove remaining moisture in a deposition chamber of the first insulating layer 516. When the first insulating layer 516 is formed in the deposition chamber evacuated using a cryopump, the impurity concentration in the first insulating layer 516 can be reduced. In addition, as an exhaustion unit for removing the residual moisture in the deposition chamber of the first insulating layer 516, a turbo pump provided with a cold trap may be used.

It is preferable that a high-purity gas from which impurities such as hydrogen, water, a hydroxyl group, or a hydride have been removed be used as a sputtering gas used for forming the first insulating layer 516.

Note that second heat treatment may be performed after the first insulating layer 516 is formed. The heat treatment is performed under a nitrogen atmosphere, an atmosphere of ultra-dry air, or a rare gas (e.g., argon or helium) atmosphere at preferably a temperature higher than or equal to 200° C. and lower than or equal to 400° C., for example, higher than or equal to 250° C. and lower than or equal to 350° C. The water content in the gas is preferably 20 ppm or less, more preferably 1 ppm or less, further preferably 10 ppb or less. For example, the heat treatment is performed at 250° C. for one hour in a nitrogen atmosphere. Alternatively, RTA treatment may be performed at high temperature for a short time as in the first heat treatment. Even when oxygen vacancy is generated in the island-shaped oxide semiconductor layer by the first heat treatment, by performing heat treatment after the first insulating layer 516 containing oxygen is provided, oxygen is supplied to the island-shaped oxide semiconductor layer from the first insulating layer 516. By supplying oxygen to the island-shaped oxide semiconductor layer, oxygen vacancies that serve as donors are reduced in the island-shaped oxide semiconductor layer and the stoichiometric proportion can be satisfied. It is preferable that the proportion of oxygen in the island-shaped oxide semiconductor layer be higher than that in the stoichiometric composition. As a result, the island-shaped oxide semiconductor layer can be made to be substantially i-type and variation in electric characteristics of the transistor due to oxygen vacancy can be reduced, which results in improvement in electric characteristics. The timing of this second heat treatment is not particularly limited as long as it is after the formation of the first insulating layer 516. When the second heat treatment doubles as another step such as heat treatment for formation of a resin film or heat treatment for reduction of the resistance of a light-transmitting conductive film, the island-shaped oxide semiconductor layer can be made to be substantially i-type without increasing the number of steps.

Further, oxygen vacancies that serve as donors in the island-shaped oxide semiconductor layer may be reduced by subjecting the island-shaped oxide semiconductor layer to heat treatment in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, or the like. Alternatively, the purity of the oxygen gas which is introduced into the heat treatment apparatus is preferably greater than or equal to 6N (99.9999%), more preferably greater than or equal to 7N (99.99999%) (i.e., the impurity concentration in the oxygen is less than or equal to 1 ppm, preferably less than or equal to 0.1 ppm).

In this embodiment, the second heat treatment (preferably at temperatures ranging from 200° C. to 400° C., and for example, from 250° C. to 350° C.) is performed in an inert gas atmosphere or an oxygen gas atmosphere. For example, the second heat treatment is performed at 250° C. for one hour in a nitrogen atmosphere. The second heat treatment is performed while part (a channel formation region) of the oxide semiconductor layer is in contact with the first insulating layer 516.

The second heat treatment has the following effect. By the above first heat treatment, in some cases, oxygen which is one of main components of the oxide semiconductor is reduced while impurities such as hydrogen, moisture, a hydroxyl group, or a hydride (also referred to as a hydrogen compound) are intentionally removed from the oxide semiconductor layer. Since the second heat treatment supplies oxygen to the oxide semiconductor layer subjected to the first heat treatment, the oxide semiconductor layer is purified to become an electrically i-type (intrinsic) semiconductor.

Figure 6D:
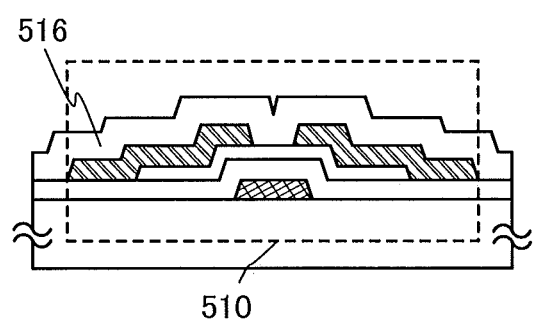
Figure 6E:
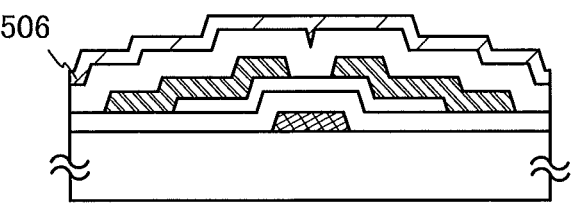

Through the above steps, a transistor 510 is formed (see FIG. 6D). The transistor 510 is a channel-etched transistor including the gate electrode layer 511, the gate insulating layer 507 over the gate electrode layer 511, the island-shaped oxide semiconductor layer 531 overlapping with the gate electrode layer 511 with the gate insulating layer 507 placed therebetween, and a pair of source electrode layer 515*a* and drain electrode layer 515*b* formed over the island-shaped oxide semiconductor layer 531.

When a silicon oxide layer having a lot of defects is used as the first insulating layer 516, heat treatment after formation of the silicon oxide layer has an effect of diffusing impurities such as hydrogen, moisture, a hydroxyl group, or a hydride contained in the oxide semiconductor layer into the oxide insulating layer so that the impurities contained in the oxide semiconductor layer can be further reduced.

In addition, when a silicon oxide layer containing excessive oxygen is used as the first insulating layer 516, oxygen in the first insulating layer 516 is moved to the oxide semiconductor layer 531 by heat treatment performed after the formation of the first insulating layer 516, so that the oxygen concentration in the oxide semiconductor layer 531 can be increased and the oxide semiconductor layer 531 can be purified.

A second insulating layer 506 serving as a protective insulating layer may be further stacked over the first insulating layer 516. As the second insulating layer 506, a silicon nitride film is formed by RF sputtering, for example. RF sputtering has high productivity, and thus is preferably used as a method for forming the protective insulating layer. As the protective insulating layer, an inorganic insulating film that does not contain impurities such as moisture and blocks the entry of the impurities from the outside is used; for example, a silicon nitride film or an aluminum nitride film is used. A silicon nitride film and an aluminum nitride film are particularly effective as barrier films against hydrogen ions or hydrogen molecules, and either of these is preferably formed over the first insulating layer 516. In this embodiment, the second insulating layer 506 is formed using a silicon nitride film (see FIG. 6E).

In this embodiment, as the second insulating layer 506, a silicon nitride film is formed in the following manner: the substrate 505 over which layers up to and including the first insulating layer 516 are formed is heated at a temperature of 100° C. to 400° C., a sputtering gas containing high-purity nitrogen from which hydrogen and moisture have been removed is introduced, and a silicon target is used. In that case, the second insulating layer 506 is preferably formed while moisture remaining in the treatment chamber is removed, as in the case of the first insulating layer 516.

After the formation of the protective insulating layer, heat treatment may be further performed at a temperature between 100° C. and 200° C. for 1 hour to 30 hours in the air. This heat treatment may be performed at a fixed heating temperature. Alternatively, the following change in the heating temperature may be conducted plural times repeatedly: the heating temperature is increased from a room temperature to a temperature of 100° C. to 200° C. and then decreased to a room temperature.

Oxygen doping treatment may be performed on the oxide semiconductor film 530 and/or the gate insulating layer 507. Note that "oxygen doping" means that oxygen (which includes at least one of an oxygen radical, an oxygen atom, and an oxygen ion) is added to a bulk. Note that the term "bulk" is used in order to clarify that oxygen is added not only to a surface of a thin film but also to the inside of the thin film. In addition, "oxygen doping" includes "oxygen plasma doping" in which oxygen plasma is added to a bulk.

The oxygen plasma doping treatment may be either a method of adding oxygen which is made to be plasma by inductively coupling plasma (ICP) or a method of adding oxygen which is made to be plasma with the use of a microwave with a frequency of 1 GHz or higher (e.g., a frequency of 2.45 GHz).

<1-7. Insulating Layer for Planarization>

A planarization layer 517 for planarization can be provided over the first insulating layer 516 (over the second insulating layer 506 in the case where the second insulating layer 506 is stacked over the first insulating layer 516). For the planarization layer 517, a resin material such as polyimide, acrylic, benzocyclobutene, polyamide, or epoxy can be used. Other than such resin materials, it is also possible to use a low-dielectric constant material (low-k material), a siloxane-based resin, PSG (phosphosilicate glass), BPSG (borophosphosilicate glass), or the like. Note that the planarization layer 517 may be formed by stacking a plurality of insulating films formed using any of these materials. There is no particular limitation on the method for forming the planarization layer 517, and the planarization layer 517 can be formed, depending on the material, by a method such as sputtering, an SOG method, spin coating, dipping, spray coating, a droplet discharge method (e.g., an inkjet method), a printing method (e.g., screen printing or offset printing), or with a tool (equipment) such as a doctor knife, a roll coater, a curtain coater, or a knife coater.

<Step 2: Formation of First Electrode>

Next, an opening 518 is formed in the first insulating layer 516 (also in the second insulating layer 506 in the case where the second insulating layer 506 is formed) and the planarization layer 517. The opening 518 reaches the source electrode layer 515a or the drain electrode layer 515b.

A conductive film is formed over the planarization layer 517. For a first electrode 601, a conductive film used for the gate electrode layer 511, a conductive film used for the source and drain electrode layers, a conductive film that transmits visible light, or the like can be used. For the conductive film that transmits visible light, a conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added can be used, for example.

Figure 7:
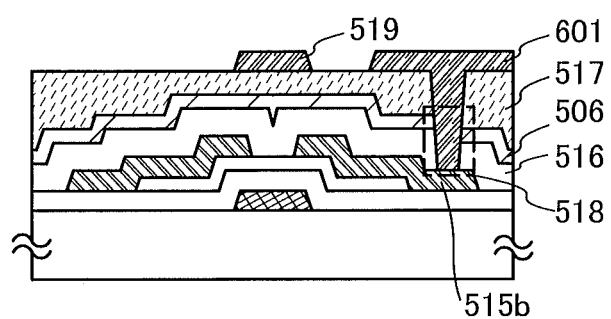
FIG. 7 illustrates a manufacturing process of a semiconductor device according to an embodiment.

Then, the conductive film is patterned to form the first electrode 601. The first electrode is connected to the source electrode layer 515a or the drain electrode layer 515b through the opening 518 (see FIG. 7).

In addition, a backgate electrode 519 may be formed in a position overlapping with the channel formation region of the oxide semiconductor layer 531 in the same step as the first electrode 601.

When the backgate electrode is formed using a conductive film with light-blocking properties, photodegradation of the transistor, such as negative-bias stress photodegradation, can be reduced and the reliability can be increased.

Through the above steps, the enhancement transistor that includes the first electrode electrically connected to the source electrode or drain electrode and the channel formation region formed of an oxide semiconductor can be manufactured.

The transistor described in this embodiment can be applied to the display device in Embodiment 1. In the display device in Embodiment 1 to which the transistor in this embodiment is applied, that is, in the light-emitting display device provided with the adsorption layer of a hydrogen ion and/or a hydrogen molecule on the opposite surface side of the second electrode having one surface in contact with the organic layer containing a light-emitting substance, a hydrogen ion and/or a hydrogen molecule produced on the organic layer side of the second electrode moves to the adsorption layer of a hydrogen ion and/or a hydrogen molecule, which is provided on the opposite side of the second electrode. This can lower the concentration of hydrogen ions and/or hydrogen molecules, which are a cause for the increase in the carrier concentration in the oxide semiconductor, in a region where the semiconductor element including an oxide semiconductor is provided on the organic layer side of the second electrode. As a result, characteristics of the semiconductor element including an oxide semiconductor and the reliability of a semiconductor device including the semiconductor element can be increased.

When an opening which a hydrogen ion and/or a hydrogen molecule passes through is provided in the second electrode, a hydrogen ion and/or a hydrogen molecule produced on the organic layer side of the second electrode can easily pass through the second electrode. This can lower the concentration of hydrogen ions and/or hydrogen molecules in the region where the semiconductor element including an oxide semiconductor is provided on the organic layer side of the second electrode; therefore, characteristics of the semiconductor element including an oxide semiconductor and the reliability of a semiconductor device including the semiconductor element can be increased.

This embodiment can be freely combined with any of the other embodiments in this specification.

Embodiment 3

In this embodiment, an example of a structure and a manufacturing method of a light-emitting element that can be applied to the semiconductor devices described in Embodiment 1 will be described with reference to FIG. 8. Specifically, a light-emitting element including a first electrode serving as one of an anode and a cathode, which is electrically connected to a source electrode or a drain electrode of a transistor having a channel formation region formed of an oxide semiconductor, a second electrode serving as the other of the anode and the cathode, and an organic layer containing a light-emitting substance between the first electrode and the second electrode will be described.

Note that the structure of the light-emitting element described as an example in this embodiment can include the first electrode as an anode and the second electrode as a cathode. Alternatively, the first electrode can serve as a cathode and the second electrode can serve as an anode. Note that the structure of an EL layer provided between the first electrode and the second electrode may be selected as appropriate in accordance with polarities and materials of the first electrode and the second electrode.

Figure 8:
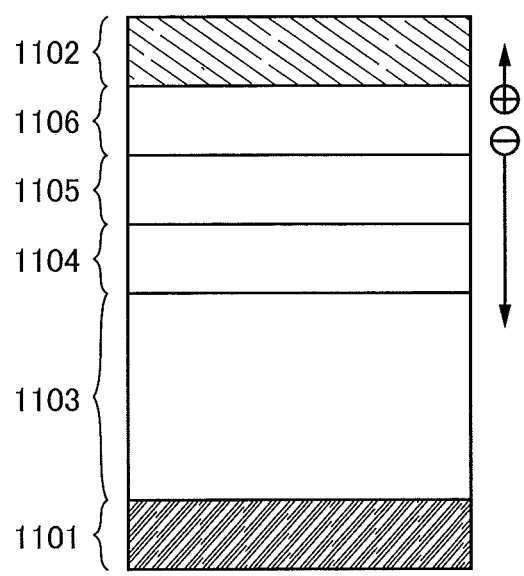
FIG. 8 illustrates a structure of a light-emitting element according to an embodiment.

FIG. 8 illustrates an example of a structure of a light-emitting element which can be used in a light-emitting device described as an example in this embodiment. In the light-emitting element illustrated in FIG. 8, an organic layer 1103 containing a light-emitting substance is interposed between an anode 1101 and a cathode 1102. A first charge generation region 1106, an electron-relay layer 1105, and an electron-injection buffer 1104 are sequentially stacked from the cathode 1102 side between the cathode 1102 and the organic layer 1103 containing a light-emitting substance.

In the first charge generation region 1106, holes and electrons are generated, and the holes move into the cathode 1102 and the electrons move into the electron-relay layer 1105. The electron-relay layer 1105 has a high electron-transport property and immediately transfers the electrons generated in the first charge generation region 1106 to the electron-injection buffer 1104. The electron-injection buffer 1104 can reduce a barrier in injection of electrons into the organic layer 1103 containing a light-emitting substance, and the efficiency of the electron injection into the organic layer 1103 containing a light-emitting substance can be improved. Thus, the electrons generated in the first charge generation region 1106 are injected into the LUMO level of the organic layer 1103 containing a light-emitting substance through the electron-relay layer 1105 and the electron-injection buffer 1104.

In addition, the electron-relay layer 1105 can prevent interaction in which a substance included in the first charge generation region 1106 and a substance included in the electron-injection buffer 1104 react with each other at the interface therebetween and the functions of the first charge generation region 1106 and the electron-injection buffer 1104 are damaged.

Next, specific materials that can be used for the light-emitting element having the above-described structure will be described. Materials for the anode, the cathode, the organic layer containing a light-emitting substance, the first charge generation region, the electron-relay layer, and the electron-injection buffer will be described in this order.

<Material for Anode>

The anode 1101 is preferably formed using a metal, an alloy, an electrically conductive compound, a mixture of these materials, or the like which has a high work function (specifically, a work function of 4.0 eV or higher). Specific examples are given below: indium tin oxide (ITO), indium tin oxide containing silicon or silicon oxide, indium zinc oxide (IZO), and indium oxide containing tungsten oxide and zinc oxide.

Films of these conductive metal oxides are usually formed by sputtering; however, a sol-gel method or the like may also be used. For example, a film of indium zinc oxide (IZO) can be formed by a sputtering method using a target in which zinc oxide is added to indium oxide at 1 wt % to 20 wt %. A film of indium oxide containing tungsten oxide and zinc oxide can be formed by a sputtering method using a target in which tungsten oxide and zinc oxide are added to indium oxide at 0.5 wt % to 5 wt % and 0.1 wt % to 1 wt %, respectively.

Besides, as a material for the anode 1101, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like. Alternatively, a conductive polymer such as poly(3,4-ethylenedioxythiophene)/poly(styrenesulfonic acid) (PEDOT/PSS) or polyaniline/poly(styrenesulfonic acid) (PAni/PSS) may be used.

Note that in the case where a second charge generation region is provided in contact with the anode 1101, a variety of conductive materials can be used for the anode 1101 regardless of their work functions. Specifically, besides a material which has a high work function, a material which has a low work function can also be used for the anode 1101. A material for forming the second charge generation region will be described later together with a material for forming the first charge generation region.

<Material for Cathode>

In the case where the first charge generation region 1106 is provided between the cathode 1102 and the organic layer 1103 containing a light-emitting substance to be in contact with the cathode 1102, a variety of conductive materials can be used for the cathode 1102 regardless of their work functions.

Note that at least one of the cathode 1102 and the anode 1101 is formed using a conductive film that transmits visible light. For the conductive film that transmits visible light, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, and indium tin oxide to which silicon oxide is added can be given. Further, a metal thin film having a thickness enough to transmit light (preferably, approximately 5 nm to 30 nm) can also be used.

<Material for Organic Layer Containing Light-Emitting Substance>

The organic layer 1103 containing a light-emitting substance includes at least a light-emitting layer, and may have a structure in which a layer other than the light-emitting layer and the light-emitting layer are stacked. Examples of the layer other than the light-emitting layer are layers containing a substance having a high hole-injection property, a substance having a high hole-transport property, a substance having a high electron-transport property, a substance having a high electron-injection property, a substance having a bipolar property (a substance having high electron-and-hole-transport properties), and the like. Specifically, a hole-injection layer, a hole-transport layer, a light-emitting layer, a hole-blocking layer, an electron-transport layer, an electron-injection layer, and the like are given, and they can be stacked as appropriate from the anode side.

Specific examples of the materials for the layers included in the above organic layer 1103 containing a light-emitting substance will be described below.

The hole-injection layer is a layer containing a substance having a high hole-injection property. As a substance having a high hole-injection property, for example, molybdenum oxide, vanadium oxide, ruthenium oxide, tungsten oxide, manganese oxide, or the like can be used. In addition, it is possible to use a phthalocyanine-based compound such as phthalocyanine (abbreviation: $H_2Pc$) or copper phthalocyanine (abbreviation: CuPc), a high molecule such as poly(3,4-ethylenedioxythiophene)/poly(styrenesulfonate) (PEDOT/PSS), or the like to form the hole-injection layer.

Note that the hole-injection layer may be formed using the second charge generation region. When the second charge generation region is used for the hole-injection layer, a variety of conductive materials can be used for the anode 1101 regardless of their work functions as described above. A material for forming the second charge generation region will be described later together with a material for forming the first charge generation region.

The hole-transport layer is a layer containing a substance having a high hole-transport property. As the substance having a high hole-transport property, the following can be given, for example: aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4-phenyl-4'-(9-phenylfluoren-9-yl)triphenylamine (abbreviation: BPAFLP), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like. Alternatively, any of the following carbazole derivatives can be used: 4,4'-di(N-carbazolyl) biphenyl (abbreviation: CBP); 1,3,5-tris[4-(N-carbazolyl) phenyl]benzene (abbreviation: TCPB); and 9-[4-(10-phenyl-9-anthracenyl)phenyl]-9H-carbazole (abbreviation: CzPA). The substances mentioned here are mainly ones that have a hole mobility of $10^{-6}$ cm$^2$/Vs or higher. However, a substance other than the above substances may also be used as long as it is a substance in which the hole-transport property is higher than the electron-transport property. The layer containing a substance having a high hole-transport property is not limited to a single layer, and two or more layers containing the aforementioned substances may be stacked.

In addition to the above substances, a high molecular compound such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can be used for the hole-transport layer.

The light-emitting layer is a layer containing a light-emitting substance. As the light-emitting substance, any of the following fluorescent compounds can be used. For example, the following can be given: N,N'-bis[4-(9H-carbazol-9-yl)phenyl]-N,N'-diphenylstilbene-4,4'-diamine (abbreviation: YGA2S); 4-(9H-carbazol-9-yl)-4'-(10-phenyl-9-anthryl)triphenylamine (abbreviation: YGAPA); 4-(9H-carbazol-9-yl)-4'-(9,10-diphenyl-2-anthryl)triphenylamine (abbreviation: 2YGAPPA); N,9-diphenyl-N-[4-(10-phenyl-9-anthryl)phenyl]-9H-carbazol-3-amine (abbreviation: PCAPA); perylene; 2,5,8,11-tetra-tert-butylperylene (abbreviation: TBP); 4-(10-phenyl-9-anthryl)-4'-(9-phenyl-9H-carbazol-3-yl)triphenylamine (abbreviation: PCBAPA); N,N"-(2-tert-butylanthracene-9,10-diyldi-4,1-phenylene)bis [N,N',N'-triphenyl-1,4-phenylenediamine] (abbreviation: DPABPA); N,9-diphenyl-N-[4-(9,10-diphenyl-2-anthryl) phenyl]-9H-carbazol-3-amine (abbreviation: 2PCAPPA); N-[4-(9,10-diphenyl-2-anthryl)phenyl]-N,N',N'-triphenyl-1, 4-phenylenediamine (abbreviation: 2DPAPPA); N,N,N',N', N",N",N"',N"'-octaphenyldibenzo[g,p]chrysene-2,7,10,15-tetraamine (abbreviation: DBC1); coumarin 30; N-(9,10-diphenyl-2-anthryl)-N,9-diphenyl-9H-carbazol-3-amine (abbreviation: 2PCAPA); N-[9,10-bis(1,1'-biphenyl-2-yl)-2-anthryl]-N,9-diphenyl-9H-carbazol-3-amine (abbreviation: 2PCABPhA); N-(9,10-diphenyl-2-anthryl)-N,N',N'-triphenyl-1,4-phenylenediamine (abbreviation: 2DPAPA); N-[9, 10-bis(1,1'-biphenyl-2-yl)-2-anthryl]-N,N',N'-triphenyl-1,4-phenylenediamine (abbreviation: 2DPABPhA); 9,10-bis(1, 1'-biphenyl-2-yl)-N-[4-(9H-carbazol-9-yl)phenyl]-N-phenylanthracen-2-amine (abbreviation: 2YGABPhA); N,N,9-triphenylanthracen-9-amine (abbreviation: DPhAPhA); coumarin 545T; N,N'-diphenylquinacridone (abbreviation: DPQd); rubrene; 5,12-bis(1,1'-biphenyl-4-yl)-6,11-diphenyltetracene (abbreviation: BPT); 2-(2-{2-[4-(dimethylamino)phenyl]ethenyl}-6-methyl-4H-pyran-4-ylidene)propanedinitrile (abbreviation: DCM1); 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2); N,N,N',N'-tetrakis(4-methylphenyl) tetracene-5,11-diamine (abbreviation: p-mPhTD); 7,14-diphenyl-N,N,N',N'-tetrakis(4-methylphenyl)acenaphtho [1,2-a]fluoranthene-3,10-diamine (abbreviation: p-mPhAFD); 2-{2-isopropyl-6-[2-(1,1,7,7-tetramethyl-2,3,6,7-tetra-hydro-1H,5H-benzo[ij]quinolizin-9-yl)ethenyl]-4H-pyran-4-ylidene}propanedinitrile (abbreviation: DCJTI); 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB); 2-(2,6-bis{2-[4-(dimethylamino)phenyl]ethenyl}-4H-pyran-4-ylidene)propanedinitrile (abbreviation: BisDCM); 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM); and SD1 (product name; manufactured by SFC Co., Ltd).

As the light-emitting substance, any of the following phosphorescent compounds can also be used. The following can be given, for example: bis[2-(4',6'-difluorophenyl) pyridinato-N,$C^{2'}$]iridium(III) tetrakis(1-pyrazolyl)borate (abbreviation: FIr6); bis[2-(4',6'-difluorophenyl)pyridinato-N,$C^{2'}$]iridium(III) picolinate (abbreviation: Flrpic); bis[2-(3',5'-bistrifluoromethylphenyl)pyridinato-N,$C^{2'}$]iridium (III) picolinate (abbreviation: Ir(CF$_3$ppy)$_2$(pic)); bis[2-(4',6'-difluorophenyl)pyridinato-N,$C^{2'}$]iridium(III) acetylacetonate (abbreviation: FIracac); tris(2-phenylpyridinato)iridium(III) (abbreviation: Ir(ppy)$_3$); bis(2-phenylpyridinato)iridium(III) acetylacetonate (abbreviation: Ir(ppy)$_2$(acac)); bis(benzo[h]quinolinato)iridium(III) acetylacetonate (abbreviation: Ir(bzq)$_2$(acac)); bis(2,4-diphenyl-1,3-oxazolato-N,$C^{2'}$)iridium(III) acetylacetonate (abbreviation: Ir(dpo)$_2$(acac)); bis[2-(4'-perfluorophenylphenyl) pyridinato]iridium(III) acetylacetonate (abbreviation: Ir(p-PF-ph)$_2$(acac)); bis(2-phenylbenzothiazolato-N,$C^{2'}$)iridium (III) acetylacetonate (abbreviation: Ir(bt)$_2$(acac)); bis[2-(2'-benzo[4,5-a]thienyl)pyridinato-N,$C^{3'}$]iridium(III) acetylacetonate (abbreviation: Ir(btp)$_2$(acac)); bis(1-phenylisoquinolinato-N,$C^{2'}$)fridium(III) acetylacetonate (abbreviation: Ir(piq)$_2$(acac)); (acetylacetonato)bis[2,3-bis(4-fluorophenyl)quinoxalinato]iridium(III) (abbreviation: Ir(Fdpq)$_2$ (acac)); (acetylacetonato)bis(2,3,5-triphenylpyrazinato)iridium(III) (abbreviation: Ir(tppr)$_2$(acac)); 2,3,7,8,12,13,17,18-octaethyl-21H,23H-porphyrin platinum (II) (abbreviation: PtOEP); tris(acetylacetonato)(monophenanthroline)terbium(III) (abbreviation: Tb(acac)$_3$ (Phen)); tris(1,3-diphenyl-1,3-propanedionato) (monophenanthroline)europium(III) (abbreviation: Eu(DBM)$_3$(Phen)); tris[1-(2-thenoyl)-3,3,3-trifluoroacetonato] (monophenanthroline)europium(III) (abbreviation: Eu(TTA)$_3$(Phen)); and (dipivaloylmethanato)bis(2,3,5-triphenylpyrazinato)iridium(III) (abbrebiation: Ir(tppr)$_2$ (dpm)).

Note that those light-emitting substances are preferably dispersed in a host material. As the host material, for example, the following can be used: an aromatic amine compound such as NPB (abbreviation), TPD (abbreviation), TCTA (abbreviation), TDATA (abbreviation), MTDATA (abbreviation), or BSPB (abbreviation); a carbazole derivative such as PCzPCA1 (abbreviation), PCzPCA2 (abbreviation), PCzPCN1 (abbreviation), CBP (abbreviation), TCPB (abbreviation), CzPA (abbreviation), 9-phenyl-3-[4-(10-phenyl-9-anthryl)phenyl]-9H-carbazole (abbreviation: PCzPA), or 4-phenyl-4'-(9-phenyl-9H-carbazol-3-yl)triphenylamine (abbreviation: PCBA1BP); a substance having a high hole-transport property which contains a high molecular compound, such as PVK (abbreviation), PVTPA (abbreviation), PTPDMA (abbreviation), or Poly-TPD (abbreviation); a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq); a metal complex having an oxazole-based or thiazole-based ligand, such as bis[2-(2-hydroxyphenyl)benzoxazolato]zinc (abbreviation: $Zn(BOX)_2$) or bis[2-(2-hydroxyphenyl)-benzothiazolato]zinc (abbreviation: $Zn(BTZ)_2$); or a substance having a high electron-transport property, such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), bathophenanthroline (abbreviation: BPhen), or bathocuproine (abbreviation: BCP).

The electron-transport layer is a layer containing a substance having a high electron-transport property. As the substance having a high electron-transport property, for example, a metal complex having a quinoline skeleton or a benzoquinoline skeleton, such as Alq (abbreviation), $Almq_3$ (abbreviation), $BeBq_2$ (abbreviation), or BAlq (abbreviation) can be used. In addition to the above, a metal complex having an oxazole-based or thiazole-based ligand, such as $Zn(BOX)_2$ (abbreviation) or $Zn(BTZ)_2$ (abbreviation) can also be used. Further, besides the metal complex, PBD (abbreviation), OXD-7 (abbreviation), CO11 (abbreviation), TAZ (abbreviation), BPhen (abbreviation), BCP (abbreviation), 2-[4-(dibenzothiophen-4-yl)phenyl]-1-phenyl-1H-benzimidazole (abbreviation: DBTBIm-II), or the like can also be used. The substances mentioned here are mainly ones that have an electron mobility of $10^{-6}$ $cm^2/Vs$ or higher. Note that a substance other than the above substances may be used as long as it is a substance in which the electron-transport property is higher than the hole-transport property. Further, the electron-transport layer is not limited to a single layer, and may have a structure in which two or more layers containing the aforementioned substances are stacked.

Alternatively, a high molecular compound can be used. For example, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy), or the like can be used.

The electron-injection layer is a layer containing a substance having a high electron-injection property. As the substance having a high electron-injection property, the following can be given: an alkali metal, an alkaline earth metal, and a compound thereof, such as lithium (Li), cesium (Cs), calcium (Ca), lithium fluoride (LiF), cesium fluoride (CsF), and calcium fluoride ($CaF_2$). Alternatively, a layer containing a substance having an electron-transport property and an alkali metal, an alkaline earth metal, or a compound thereof (e.g., Alq containing magnesium (Mg)) can be used. Such a structure makes it possible to increase the efficiency of the electron injection from the cathode 1102.

As a method for forming the organic layer 1103 containing a light-emitting substance by combining these layers as appropriate, any of a variety of methods (e.g., a dry process and a wet process) can be selected as appropriate. For example, a vacuum evaporation method, an inkjet method, a spin coating method, or the like may be selected in accordance with a material to be used. Note that a different formation method may be employed for each layer.

<Material for Charge Generation Region>

The first charge generation region 1106 and the second charge generation region are regions containing a substance having a high hole-transport property and an acceptor substance. The charge generation region is not limited to a structure in which a substance having a high hole-transport property and an acceptor substance are contained in the same film, and may have a structure in which a layer containing a substance having a high hole-transport property and a layer containing an acceptor substance are stacked. Note that in the case of a stacked-layer structure in which the first charge generation region is provided on the cathode side, the layer containing the substance having a high hole-transport property is in contact with the cathode 1102, and in the case of a stacked-layer structure in which the second charge generation region is provided on the anode side, the layer containing the acceptor substance is in contact with the anode 1101.

Note that the acceptor substance is preferably added to the charge generation region so that the mass ratio of the acceptor substance to the substance having a high hole-transport property is greater than or equal to 0.1:1 and less than or equal to 4.0:1.

As the acceptor substance that is used for the charge generation region, a transition metal oxide and an oxide of a metal belonging to Groups 4 to 8 of the periodic table can be given. Specifically, molybdenum oxide is particularly preferable. Note that molybdenum oxide has a low hygroscopic property.

As the substance having a high hole-transport property used for the charge generation region, any of a variety of organic compounds such as an aromatic amine compound, a carbazole derivative, an aromatic hydrocarbon, and a high molecular compound (such as an oligomer, a dendrimer, or a polymer) can be used. Specifically, a substance having a hole mobility of $10^{-6}$ $cm^2/Vs$ or higher is preferably used. However, a substance other than the above substances may be used as long as it is a substance in which the hole-transport property is higher than the electron-transport property.

<Material for Electron-Relay Layer>

The electron-relay layer 1105 is a layer that can immediately receive electrons drawn out by the acceptor substance in the first charge generation region 1106. Therefore, the electron-relay layer 1105 is a layer containing a substance having a high electron-transport property, and the LUMO level thereof is positioned between the acceptor level of the acceptor substance in the first charge generation region 1106 and the LUMO level of the organic layer 1103 containing a light-emitting substance. Specifically, it is preferable that the LUMO level of the electron-relay layer 1105 be approximately greater than or equal to −5.0 eV and less than or equal to −3.0 eV.

As the substance used for the electron-relay layer 1105, for example, a perylene derivative and a nitrogen-containing condensed aromatic compound can be given. Note that a nitrogen-containing condensed aromatic compound is preferably used for the electron-relay layer 1105 because of its stability. Among nitrogen-containing condensed aromatic compounds, a compound having an electron-withdrawing group such as a cyano group or a fluoro group is preferably used because such a compound further facilitates reception of electrons in the electron-relay layer 1105.

As specific examples of the perylene derivative, the following can be given: 3,4,9,10-perylenetetracarboxylic dianhydride (abbreviation: PTCDA), 3,4,9,10-perylenetetracarboxylic bisbenzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (abbreviation: Hex PTC), and the like.

As specific examples of the nitrogen-containing condensed aromatic compound, the following can be given: pirazino[2,3-f][1,10]phenanthroline-2,3-dicarbonitrile (abbreviation: PPDN), 2,3,6,7,10,11-hexacyano-1,4,5,8,9,12- hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Besides, 7,7,8,8-tetracyanoquinodimethane (abbreviation: TCNQ), 1,4,5,8-naphthalenetetracarboxylic dianhydride (abbreviation: NTCDA), perfluoropentacene, copper hexadecafluorophthalocyanine (abbreviation: F$_{16}$CuPc), N,N'-bis(2,2,3,3,4,4,5,5,6,6,7,7,8,8,8-pentadecafluoroodyl)-1,4,5,8-naphthalenetetracarboxylic diimide (abbreviation: NTCDI-C8F), 3',4'-dibutyl-5,5''-bis(dicyanomethylene)-5,5''-dihydro-2,2':5',2''-terthiophen (abbreviation: DCMT), methanofullerene (e.g., [6,6]-phenyl C$_{61}$ butyric acid methyl ester), or the like can be used for the electron-relay layer 1105.

<Material for Electron-Injection Buffer>

The electron-injection buffer 1104 is a layer which facilitates electron injection from the first charge generation region 1106 into the organic layer 1103 containing a light-emitting substance. The provision of the electron-injection buffer 1104 between the first charge generation region 1106 and the organic layer 1103 containing a light-emitting substance makes it possible to reduce the injection barrier therebetween.

A substance having a high electron-injection property can be used for the electron-injection buffer 1104. For example, an alkali metal, an alkaline earth metal, a rare earth metal, a compound thereof (e.g., an alkali metal compound (including an oxide such as lithium oxide, a halide, and carbonate such as lithium carbonate or cesium carbonate), an alkaline earth metal compound (including an oxide, a halide, and carbonate), or a rare earth metal compound (including an oxide, a halide, and carbonate)) can be used.

Further, in the case where the electron-injection buffer 1104 contains a substance having a high electron-transport property and a donor substance, the donor substance is preferably added so that the mass ratio of the donor substance to the substance having a high electron-transport property is greater than or equal to 0.001:1 and less than or equal to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound thereof (e.g., an alkali metal compound (including an oxide such as lithium oxide, a halide, and carbonate such as lithium carbonate or cesium carbonate), an alkaline earth metal compound (including an oxide, a halide, and carbonate), and a rare earth metal compound (including an oxide, a halide, and carbonate)). Note that as the substance having a high electron-transport property, a material similar to the above-described material for the electron-transport layer that can be formed in part of the organic layer 1103 containing a light-emitting substance can be used.

The light-emitting element described in this embodiment can be manufactured by combination of the above-described materials. Light emission from the above-described light-emitting substance can be obtained with this light-emitting element, and the emission color can be selected by changing the type of the light-emitting substance. Further, a plurality of light-emitting substances which emit light of different colors can be used, whereby, for example, white light emission can also be obtained by expanding the width of the emission spectrum. Note that in order to obtain white light emission, light-emitting substances whose emission colors are complementary may be used; for example, different layers whose emission colors are complementary can be used. Specific examples of complementary colors include "blue and yellow", "blue-green and red", and the like.

The light-emitting element described in this embodiment can be applied to the display device in Embodiment 1. In the display device in Embodiment 1 to which the light-emitting element in this embodiment is applied, that is, in the light-emitting display device provided with the adsorption layer of a hydrogen ion and/or a hydrogen molecule on the opposite surface side of the second electrode having one surface in contact with the organic layer containing a light-emitting substance, a hydrogen ion and/or a hydrogen molecule produced on the organic layer side of the second electrode moves to the adsorption layer of a hydrogen ion and/or a hydrogen molecule, which is provided on the opposite side of the second electrode. This can lower the concentration of hydrogen ions and/or hydrogen molecules, which are a cause for the increase in the carrier concentration in the oxide semiconductor, in a region where the semiconductor element including an oxide semiconductor is provided on the organic layer side of the second electrode. As a result, characteristics of the semiconductor element including an oxide semiconductor and the reliability of a semiconductor device including the semiconductor element can be increased.

When an opening which a hydrogen ion and/or a hydrogen molecule passes through is provided in the second electrode, a hydrogen ion and/or a hydrogen molecule produced on the organic layer side of the second electrode can easily pass through the second electrode. This can lower the concentration of hydrogen ions and/or hydrogen molecules in the region where the semiconductor element including an oxide semiconductor is provided on the organic layer side of the second electrode; therefore, characteristics of the semiconductor element including an oxide semiconductor and the reliability of a semiconductor device including the semiconductor element can be increased.

This embodiment can be combined with any of the other embodiments in this specification as appropriate.

What is claimed is:

1. A semiconductor device, comprising:
   a transistor; and
   a light-emitting element electrically connected to the transistor, the light-emitting element comprising an electroluminescent layer,
   wherein a through hole of an electrode of the light-emitting element overlaps with a channel formation region of the transistor.

2. The semiconductor device according to claim 1, wherein the channel formation region comprises an oxide semiconductor.

3. The semiconductor device according to claim 1, further comprising:
   a second transistor electrically connected to the transistor,
   wherein a second through hole of the electrode of the light-emitting element overlaps with a channel formation region of the second transistor.

* * * * *